(12) United States Patent
Hatade

(10) Patent No.: US 8,421,157 B2
(45) Date of Patent: Apr. 16, 2013

(54) SEMICONDUCTOR DEVICE

(75) Inventor: Kazunari Hatade, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 78 days.

(21) Appl. No.: 12/891,842

(22) Filed: Sep. 28, 2010

(65) Prior Publication Data

US 2011/0018028 A1 Jan. 27, 2011

Related U.S. Application Data

(62) Division of application No. 11/554,659, filed on Oct. 31, 2006, now Pat. No. 7,829,955.

(30) Foreign Application Priority Data

Dec. 21, 2005 (JP) ................................. 2005-367544
Mar. 31, 2006 (JP) ................................. 2006-098740

(51) Int. Cl.
  *H01L 29/76* (2006.01)
(52) U.S. Cl.
  USPC ............ 257/370; 257/565; 257/E29.027; 257/E29.066; 257/E29.127; 257/E21.382
(58) Field of Classification Search ............ 257/370, 257/565, E29.027, E29.066, E29.197, E21.382
  See application file for complete search history.

(56) References Cited

U.S. PATENT DOCUMENTS

| 5,654,561 A * | 8/1997 | Watabe ........................ 257/139 |
| 5,731,603 A | 3/1998 | Nakagawa et al. |
| 5,869,850 A * | 2/1999 | Endo et al. .................... 257/139 |
| 6,064,086 A | 5/2000 | Nakagawa et al. |
| 6,191,453 B1 | 2/2001 | Petruzzello et al. |
| 6,191,456 B1 | 2/2001 | Stoisiek et al. |

(Continued)

FOREIGN PATENT DOCUMENTS

| DE | 198 28 669 A1 | 1/2000 |
| DE | 696 25 417 T2 | 10/2003 |

(Continued)

OTHER PUBLICATIONS

Chinese Office Action issued on Nov. 22, 2010 in corresponding Chinese Application No. 200910204953.9 filed on Dec. 13, 2006 (with an English Translation).

(Continued)

*Primary Examiner* — Tucker Wright
(74) *Attorney, Agent, or Firm* — Oblon, Spivak, McClelland, Maier & Neustadt, L.L.P.

(57) ABSTRACT

A horizontal semiconductor device includes a semiconductor substrate of a first conductivity type and a semiconductor region of a second conductivity type on the semiconductor substrate. The device includes a collector layer of the first conductivity type within the semiconductor region, an endless base layer of the first conductivity type within the semiconductor region, and an endless first emitter layer of the second conductivity type in the endless base layer. The endless base layer is off the collector layer but surrounds the collector layer. A movement of carriers between the endless first emitter layer and the collector layer is controlled in a channel region formed in the endless base layer. An insulation film is disposed between the semiconductor substrate and the semiconductor region. A region of the first conductivity type is disposed in the semiconductor region to contact with a surface of the endless base layer nearest the semiconductor substrate.

8 Claims, 48 Drawing Sheets

U.S. PATENT DOCUMENTS

| | | |
|---|---|---|
| 6,642,599 B1 | 11/2003 | Watabe et al. |
| 6,650,001 B2 | 11/2003 | Yamaguchi et al. |
| 7,652,350 B2 | 1/2010 | Hatade |
| 2001/0025961 A1* | 10/2001 | Nakamura et al. ............ 257/107 |
| 2002/0096741 A1 | 7/2002 | Yamaguchi et al. |
| 2002/0125542 A1* | 9/2002 | Suzuki et al. ................. 257/500 |

FOREIGN PATENT DOCUMENTS

| | | |
|---|---|---|
| DE | 690 34 157 T2 | 9/2005 |
| EP | 0 690 512 A1 | 1/1996 |
| JP | 3-211771 | 9/1991 |
| JP | 9-120995 | 5/1997 |
| JP | 9-148574 | 6/1997 |
| JP | A 10-335655 | 12/1998 |
| JP | 11-266018 | 9/1999 |
| JP | 2000-286416 | 10/2000 |
| JP | 2002-270844 | 9/2002 |
| JP | 3647802 B2 | 5/2005 |

OTHER PUBLICATIONS

Japanese Office Action issued Nov. 15, 2011, in Patent Application No. 2006-098740.

Office Action issued Jul. 28, 2011 in German Patent Application No. 10 2006 058 228.4 (with English translation).

* cited by examiner

SEMICONDUCTOR DEVICE

CROSS-REFERENCE TO RELATED APPLICATION

This application is a divisional of and claims the benefit of priority under 35 U.S.C. §120 from U.S. Ser. No. 11/554,659, filed Oct. 31, 2006, and claims the benefit of priority under 35 U.S.C. §119 from Japanese Patent Application No. 2005-367544, filed on Dec. 21, 2005 and No. 2006-98740, filed on Mar. 31, 2006. The contents of all of those documents are incorporated herein by reference in their entirety.

BACKGROUND OF THE INVENTION

1. Field of the Invention
Technical Field

The present invention relates to a semiconductor device, and more particularly, to a high-voltage power semiconductor device.

2. Description of the Related Art
Background Art

FIG. 49 is a top view of a conventional horizontal n-channel IGBT (Insulated Gate Bipolar Transistor) generally denoted at 700. FIG. 50 is a cross sectional view of FIG. 49 taken along the direction X-X.

As shown in FIG. 50, the IGBT 700 includes a p-type substrate 1. The p-type substrate 1 seats an n⁻ layer 2 in which an n-type buffer layer 3 is formed. There is a p-type collector layer 4 in the n-type buffer layer 3.

A p-type base layer 5 is formed in the n⁻ layer 2, over a predetermined distance from the p-type collector layer 4. In the p-type base layer 5, an n-type emitter layer (n⁺) 6 is formed so that it is on the inner side relative to a peripheral portion of the p-type base layer 5 and shallower than the p-type base layer 5. A p-type emitter layer (p⁺) 7 as well is formed in the p-type base layer 5.

A field oxide film 8 is formed on the surface of the n⁻ layer 2 which is located between the n-type buffer layer and the p-type base layer 5. On a channel region 15 formed in the p-type base layer 5 and located between the emitter layer 6 and the n⁻ layer 2, a gate wire 10 is disposed via a gate oxide film 9. Further, there is a protection film 11 which is disposed covering the field oxide film 8 and the like.

A gate electrode 12 is disposed such that it is electrically connected with the gate wire 10. An emitter electrode 13 is further disposed such that it is electrically connected with both the n-type emitter layer 6 and the p-type emitter layer 7. In addition, a collector electrode 14 is disposed such that it is electrically connected with the p-type collector layer 4. The emitter electrode 13, the collector electrode 14 and the gate electrode 12 are electrically isolated from each other.

As shown in FIG. 49, the p-type collector layer 4 is located at the center of the IGBT 700 in which structure the n-type buffer layer 3, the n⁻ layer 2, the p-type base layer 5, the n-type emitter layer 6 and the p-type emitter layer 7 surround the p-type collector layer 4 in this order, and this structure has an endless shape which is defined by connecting two semicircular sections by straight sections. For easy understanding, FIG. 49 omits the field oxide film 8, the gate oxide film 9, the gate wire 10, the gate electrode 12, the protection film 11, the emitter electrode 13 and the collector electrode 14 (JPB 3647802).

SUMMARY OF THE INVENTION

FIG. 51 shows a collector-emitter current ($I_{CE}$) characteristic which the IGBT 1000 exhibits upon application of a collector-emitter voltage ($V_{CE}$) in a condition that a constant gate-emitter voltage ($V_{GE}$) is applied upon the IGBT 700. The collector-emitter voltage ($V_{CE}$) is measured along the horizontal axis, whereas the vertical axis denotes the collector-emitter current ($I_{CE}$). A room temperature is a temperature for measurement.

From FIG. 51, one can see that as $V_{CE}$ gradually rises, ICE becomes approximately 0.2 A when $V_{CE}$ reaches 6V or becomes close to 6V and beyond this, $I_{CE}$ tends to get saturated. This causes a problem that however high $V_{CE}$ becomes, $I_{CE}$ will not become sufficiently large. There is another problem that as the gradient expressing $I_{CE}$ remains moderate while $V_{CE}$ grows from 0V to 6V and the ON-resistance ($V_{CE}/I_{CE}$) is therefore high.

FIG. 52 shows the turn-off waveform of the IGBT 700. The turn-off time is measured along the horizontal axis and the collector-emitter voltage ($V_{CE}$) or the collector-emitter current ($I_{CE}$) is measured along the vertical axis. In FIG. 52, the symbol ($A_V$) denotes changes of the $V_{CE}$ value and the symbol ($A_I$) denotes changes of the $I_{CE}$ value.

As one can tell from FIG. 52, the fall time (i.e., the time needed for $I_{CE}$ to come down to 10% from 90% which is the maximum value) has a large value exceeding 1 μs. The junction-isolated (JI) horizontal IGBT 700 in which the IGBT is formed in the n⁻ layer 2 on the p-type substrate 1 thus has problem that its switching speed is slow and it has a large switching loss.

The horizontal IGBT 700 has a further problem that a short-circuit in an inverter circuit or the like latches up a parasitic thyristor which is formed by the p-type collector layer 4/the n-type buffer layer 3/the n⁻ layer 2/the p-type base layer 5/the n-type emitter layer 6 and increases the current density of the IGBT 700 so that the IGBT may get destroyed easily.

The present invention has been made to solve these problems, and accordingly, an object of the present invention is to provide a semiconductor device which exhibits an improved collector-emitter current characteristic, shortens the fall time and increases the latch-up tolerance of a parasitic thyristor.

The present invention is directed to a horizontal semiconductor device having multiple unit semiconductor elements, each of said unit semiconductor element formed by an IGBT including:
   a semiconductor substrate of a first conductivity type;
   a semiconductor region of a second conductivity type formed on the semiconductor substrate;
   a collector layer of the first conductivity type formed within the semiconductor region;
   a ring-shaped base layer of the first conductivity type formed within the semiconductor region such that the base layer is off said collector layer but surrounds said collector layer; and
   a ring-shaped first emitter layer of the second conductivity type formed in said base layer, wherein movement of carriers between the first emitter layer and the collector layer is controlled in a channel region formed in the base layer, wherein
   the unit semiconductor elements are disposed adjacent to each other.

According to the present invention, it is possible to obtain a semiconductor device which exhibits an excellent collector-emitter current characteristic and has a short fall time and in which the latch-up tolerance of a parasitic thyristor is high.

DETAILED DESCRIPTION OF THE PREFERRED EMBODIMENTS

Embodiment 1

Figure 1:
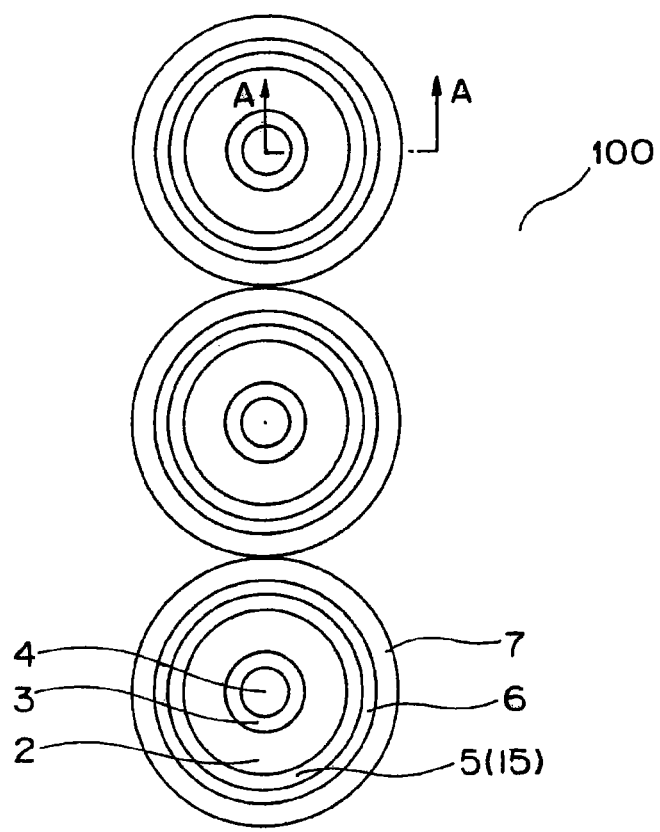
FIG. 1 is a top view of an IGBT according to an embodiment 1 of the present invention.
Figure 2:
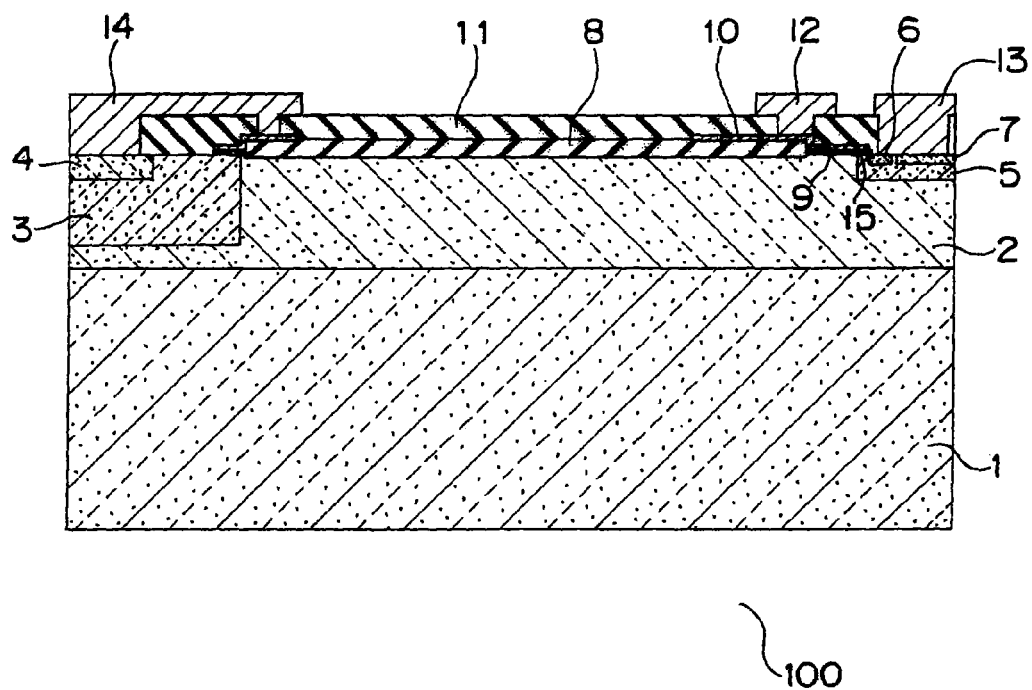
FIG. 2 is a cross sectional view of the IGBT according to the embodiment 1 of the present invention.

FIG. 1 is a top view of a horizontal n-channel IGBT (Insulated Gate Bipolar Transistor) according to the embodiment 1 of the present invention generally denoted at 100. FIG. 2 is a cross sectional view of FIG. 1 taken along the direction A-A.

As shown in FIG. 2, the IGBT 100 includes a p-type substrate 1 of silicon or the like. The p-type substrate 1 seats an n⁻ layer 2 in which an n-type buffer layer 3 is selectively formed. There is a p-type collector layer 4 selectively formed in the n-type buffer layer 3.

The buffer layer 3 may be omitted (This similarly applies also to the embodiments described below.).

In the n⁻ layer 2, the p-type base layer 5 is selectively formed in over a predetermined distance from the p-type collector layer 4. In the p-type base layer 5, the n-type emitter layers (n⁺) 6 are selectively formed so that they are located on the inner side relative to a peripheral portion of the p-type base layer 5 and shallower than the p-type base layer 5. A p-type emitter layer (p⁺) 7 as well is formed in the p-type base layer 5.

A field oxide film 8 which may be a silicon oxide film for instance is formed on the surface of the n⁻ layer 2 which is located between the n-type buffer layer 3 and the p-type base layer 5. On a channel region 15 formed in the p-type base layer 5 and located between the emitter layer 6 and the n⁻ layer 2, a gate wire 10 is disposed via a gate oxide film 9 which may be a silicon oxide film for example. The gate wire 10 is made of aluminum for example. Further, a protection film 11 which may be a silicon nitride film for instance is disposed covering the field oxide film 8, etc.

A gate electrode 12 is disposed such that it is electrically connected with the gate wire 10. The gate electrode 12 is made of aluminum for example.

An emitter electrode 13 is further disposed such that it is electrically connected with both the n-type emitter layers 6 and the p-type emitter layer 7. In addition, a collector electrode 14 is disposed such that it is electrically connected with the p-type collector layer 4. The emitter electrode 13 and the collector electrode 14 are made of aluminum for instance. The emitter electrode 13, the collector electrode 14 and the gate electrode 12 are electrically isolated from each other.

Further, as shown in FIG. 1, the IGBT 100 according to the embodiment 1 has a structure that ring-like multiple unit IGBTs, in each one of which the p-type collector layer 4 is located at the center and surrounded by the n-type buffer layer 3, the n⁻ layer 2, the p-type base layer 5, the n-type emitter layer 6 and the p-type emitter layer 7 in this order, are arranged adjacent to each other and disposed side by side. Although the foregoing has described that the unit IGBTs have circular shapes, the unit IGBTs may have oval shapes which are close to circles or polygonal shapes which are close to circles.

Figure 3:
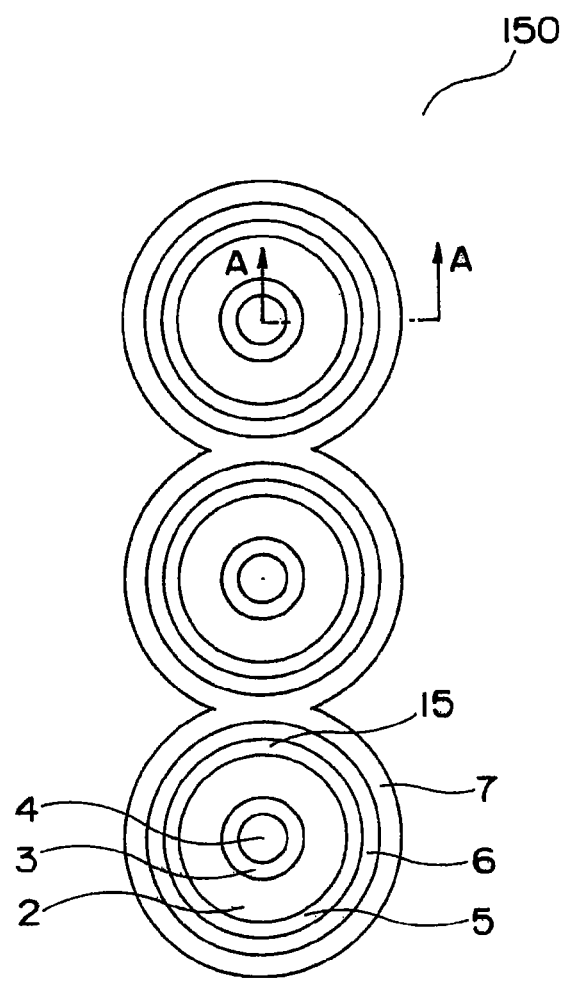
FIG. 3 is a top view of another IGBT according to the embodiment 1 of the present invention.

FIG. 3 is a top view of another IGBT according to the embodiment 1 of the present invention generally denoted at 150. This is the same structure as that of the IGBT 100 except for that the p-type emitter layers 7 of circle-like adjacent unit IGBTs partially overlap each other.

Figure 4:
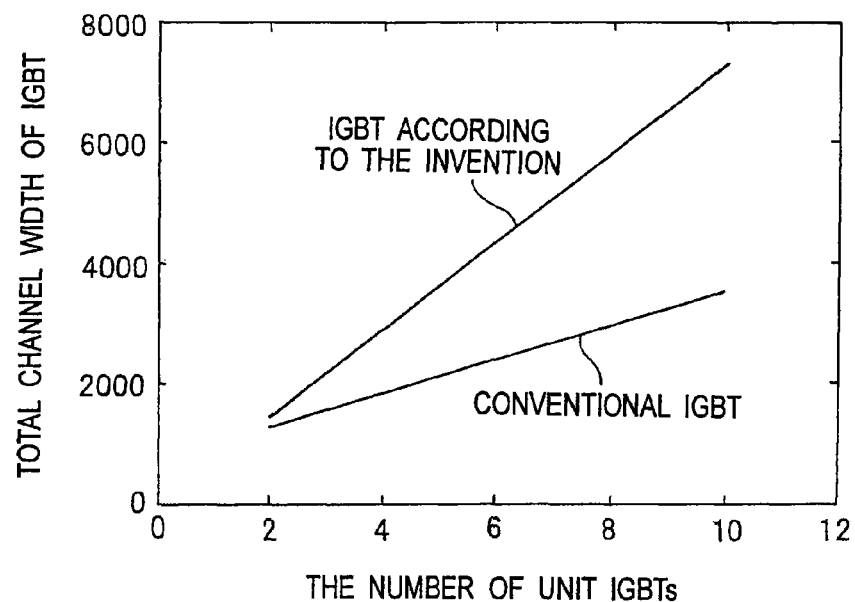
FIG. 4 shows a relationship between the number of unit IGBTs included in the IGBT according to the embodiment 1 of the present invention and the total channel width.

FIG. 4 shows a relationship between the number of unit IGBTs and the total channel width, each in an instance that an IGBT is formed by a single conventional IGBT 700 which is long and thin and has an endless shape and an instance that an IGBT is like the IGBT 150 according to the embodiment 1 which is formed by plural circular unit IGBTs. In FIG. 4, the horizontal axis denotes the number of unit IGBTs and the vertical axis denotes the total channel width.

Where multiple circular unit IGBTs are disposed side by side, the total channel width is longer as compared with where only one thing and long IGBT is used: The total channel width in an instance that ten unit IGBTs are disposed side by side is approximately double the channel width of one IGBT.

Figure 5:
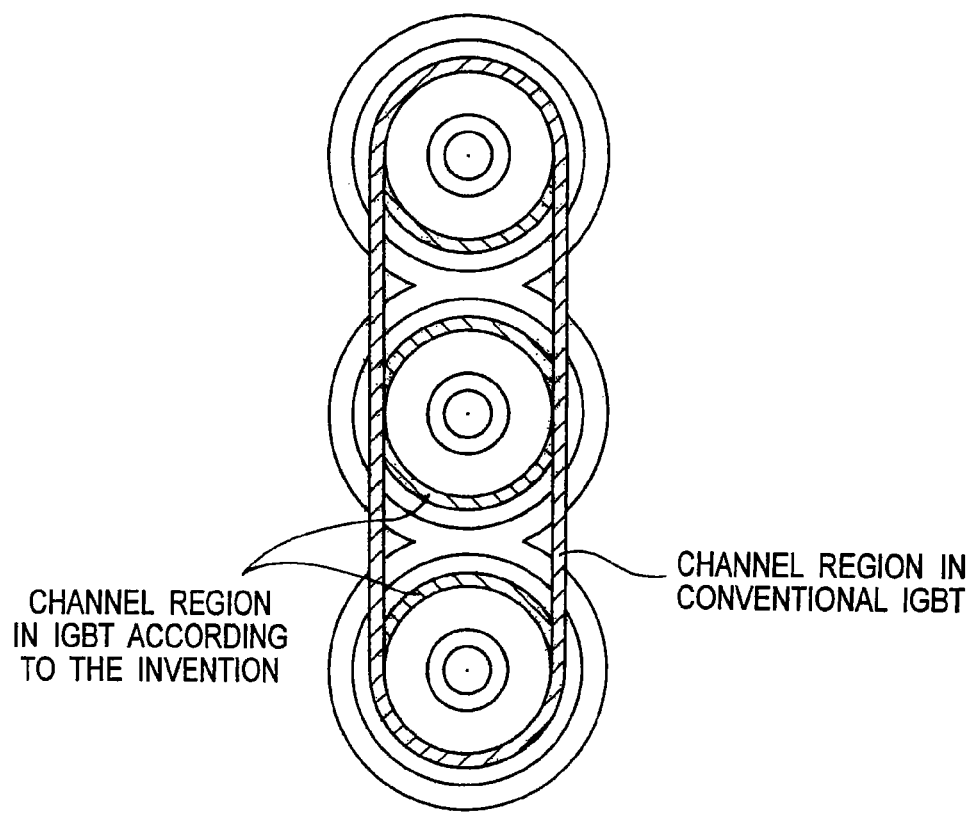
FIG. 5 shows a channel region of a conventional IGBT over the IGBT according to the embodiment of the present invention.

FIG. 5 shows a channel region of the conventional IGBT 700 over the IGBT 150 which is formed by three unit IGBTs. It is seen that use of the IGBT 150 according to the embodiment 1 increases the channel width.

Figure 6:
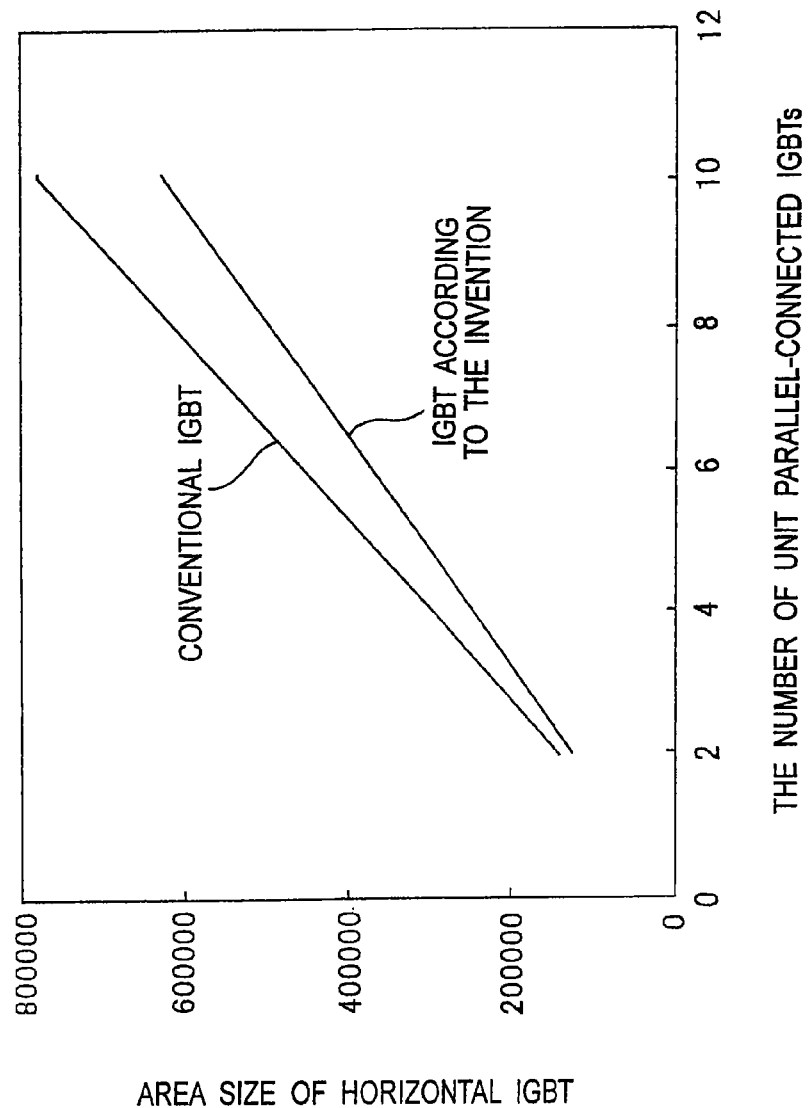
FIG. 6 is a graph which compares the surface area size of the IGBT according to the embodiment 1 of the present invention with that of a conventional IGBT.

FIG. 6 is a graph which compares the surface area sizes (occupation area sizes) of the IGBT 150 according to the embodiment 1 and the conventional IGBT which are compared against each other in FIG. 5. The horizontal axis denotes the number of unit IGBTs, while the vertical axis denotes the surface area size of the IGBT. It is seen that more unit IGBTs in the structure, the smaller the surface area size is, as compared with the IGBT 700 which has the conventional structure.

Figure 7:
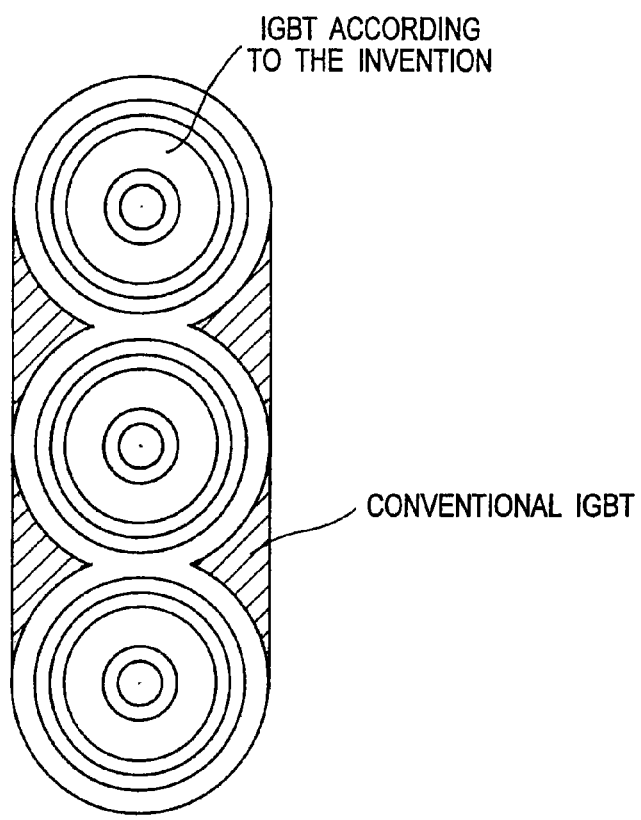
FIG. 7 is a graph which compares the surface area size of the IGBT according to the embodiment 1 of the present invention with that of a conventional IGBT.

As shown in FIG. 7, for instance, in the event that the IGBT 150 is formed by three unit IGBTs, the surface area size indicated by the shaded area can be reduced as compared with the IGBT 700 which has the conventional structure.

In the event that a horizontal IGBT is to be formed in an area of a limited space, use of the IGBT 100 or 150 according to the embodiment 1 reduces the surface area size (occupation area size) and extends the total channel width as compared with the IGBT 700 which has the conventional structure.

Figure 8:
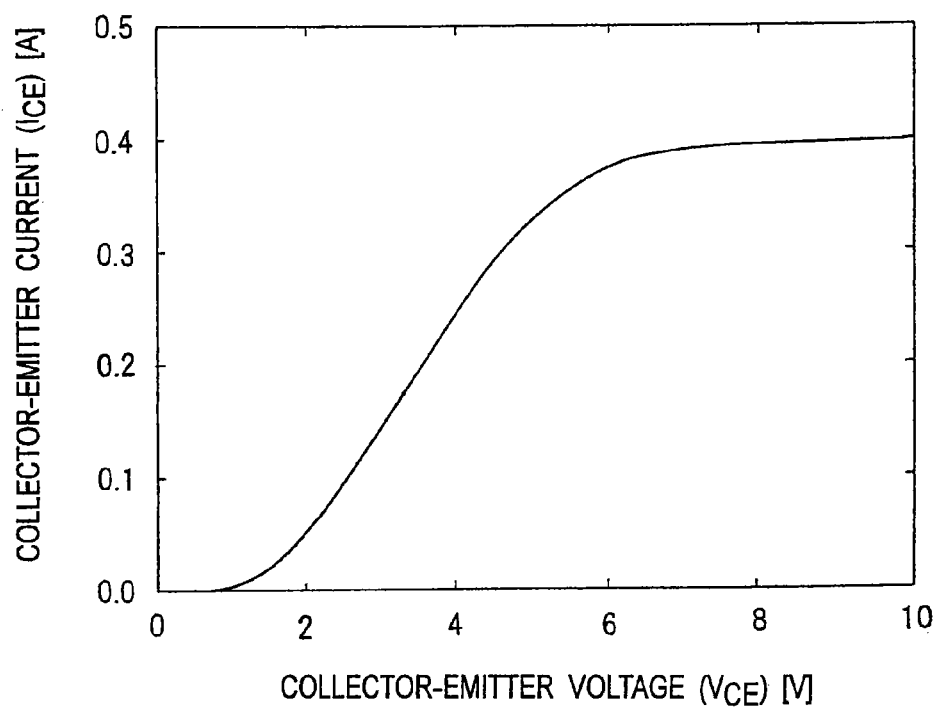
FIG. 8 shows a relationship between a collector-emitter voltage ($V_{CE}$) and a collector-emitter current ($I_{CE}$) in the IGBT according to the embodiment of the present invention.

FIG. 8 shows a collector-emitter current ($I_{CE}$) characteristic which the IGBT 1500 according to the embodiment 1 exhibits upon application of a collector-emitter voltage ($V_{CE}$) in a condition that a constant gate-emitter voltage ($V_{GE}$) is applied upon the IGBT 150. The collector-emitter voltage ($V_{CE}$) is measured along the horizontal axis, whereas the vertical axis denotes the collector-emitter current ($I_{CE}$). A room temperature is a temperature for measurement.

Figure 51:
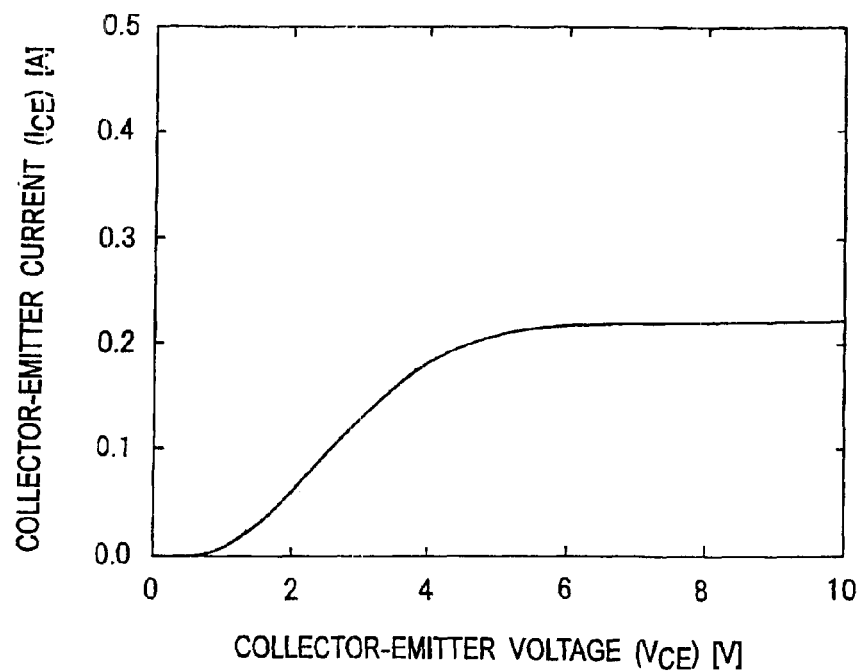
FIG. 51 shows a relationship between a collector-emitter voltage ($V_{CE}$) and a collector-emitter current ($I_{CE}$) in the conventional IGBT.

From FIG. 8, one can see that as $V_{CE}$ gradually rises, $I_{CE}$ becomes approximately 0.4 A when $V_{CE}$ reaches 6V or becomes close to 6V and around beyond this, $I_{CE}$ tends to get saturated, and $I_{CE}$ on that occasion has a large value which is about double that of the conventional IGBT (see FIG. 51). It is also seen that the gradient is greater than in the conventional IGBT while $V_{CE}$ grows from 0V to 6V and that the ON-resistance ($V_{CE}/I_{CE}$) is low.

The improved $I_{CE}$ characteristic is attributable to the longer total channel width than that of the IGBT 700 which has the conventional structure.

While FIGS. 4 through 8 refer to the IGBT 150, an approximately similar result is obtained on the IGBT 100 as well.

Embodiment 2

Figure 9:
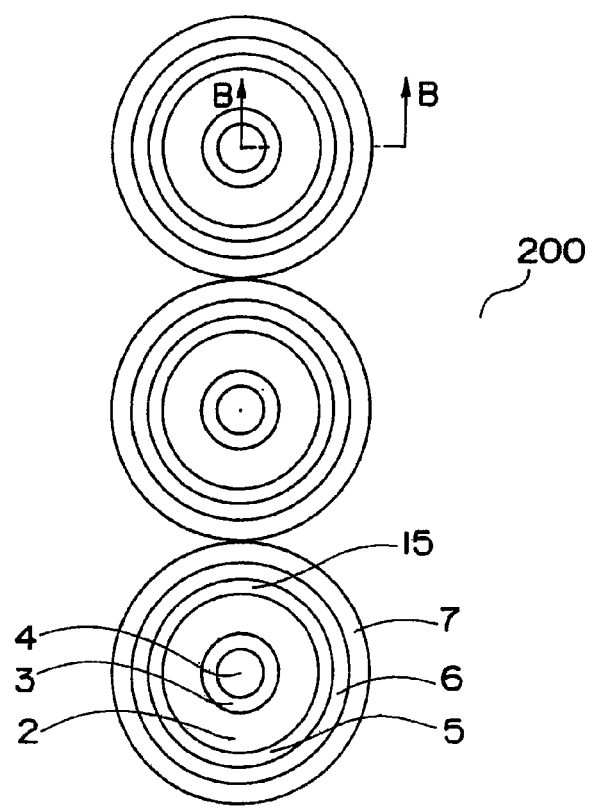
FIG. 9 is a top view of an IGBT according to an embodiment 2 of the present invention.
Figure 10:
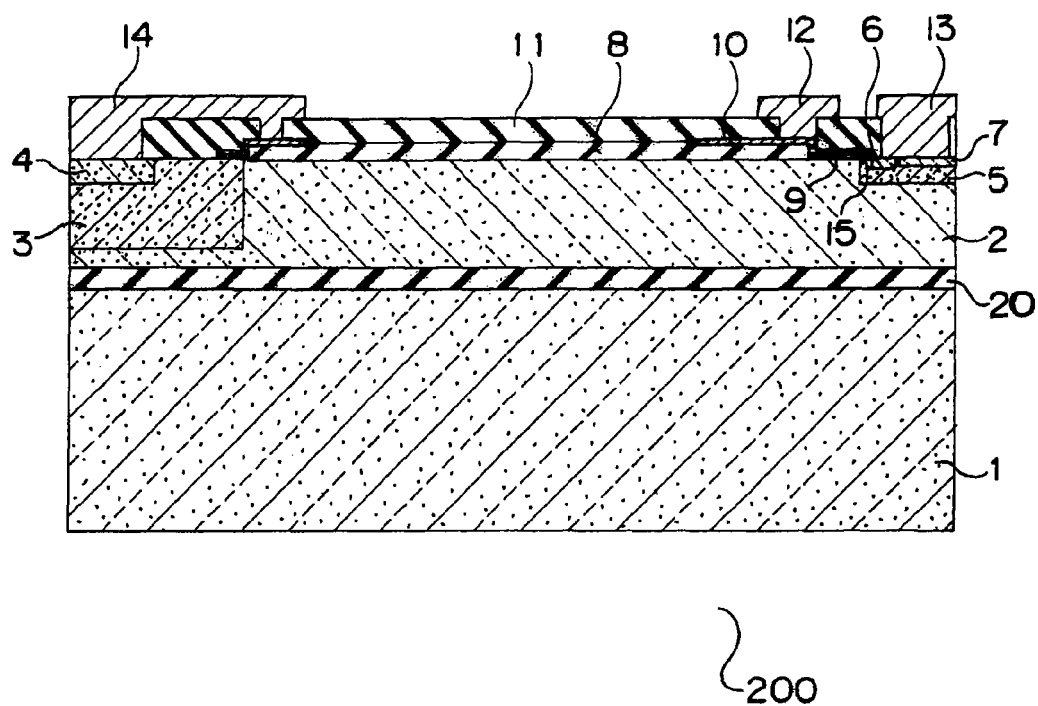
FIG. 10 is a cross sectional view of the IGBT according to the embodiment 2 of the present invention.

FIG. 9 is a top view of a horizontal n-channel IGBT according to the embodiment 2 of the present invention generally denoted at 200. FIG. 10 is a cross sectional view of FIG. 9 taken along the direction B-B. In FIGS. 9 and 10, the same reference symbols as those appearing in FIGS. 1 and 2 denote the same or corresponding portions.

As shown in FIG. 10, the IGBT 200 has an SOI structure in which a buried oxide film 20 which may be a silicon oxide film for example is formed between the p-type substrate 1 and the n⁻ layer 2. The structure is otherwise the same as that of the IGBT 100. The structure of the IGBT 200 shown in the top view in FIG. 9 is the same as the structure of the IGBT 100 shown in FIG. 2. In this structure, the conductivity type of the substrate 1 can be chosen irrespectively of the conductivity type of the n⁻ layer 2.

Figure 11:
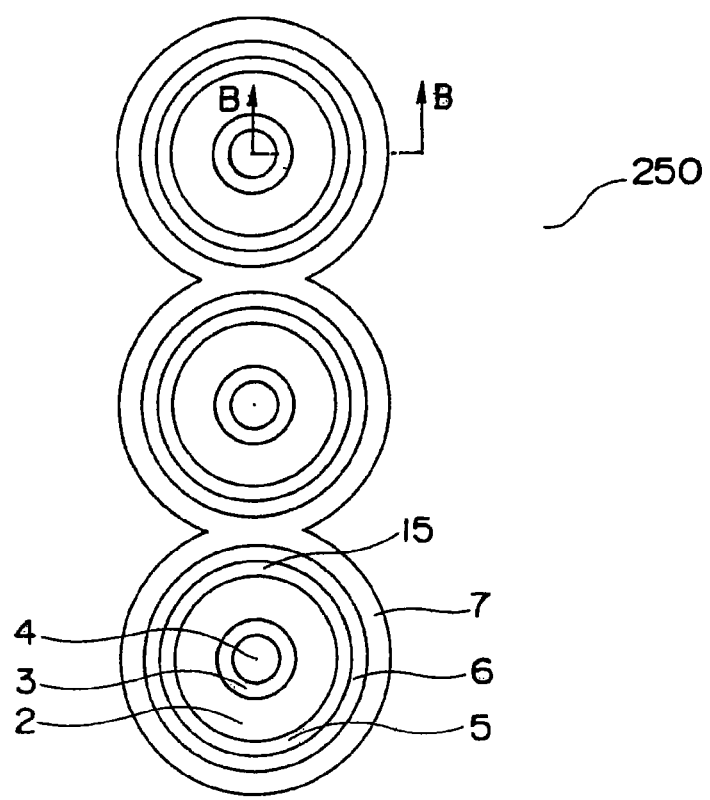
FIG. 11 is a top view of another IGBT according to the embodiment 2 of the present invention.

FIG. 11 is a top view of another IGBT according to the embodiment 2 of the present invention generally denoted at 250. This is the same structure as that of the IGBT 200 except for that the p-type emitter layers 7 of circle-like adjacent unit IGBTs partially overlap each other.

The IGBTs 100 and 150 according to the embodiment 1 may be called "the junction-isolated type" while the IGBTs 200 and 250 according to the embodiment 2 may be called "dielectric-isolated type".

Figure 12:
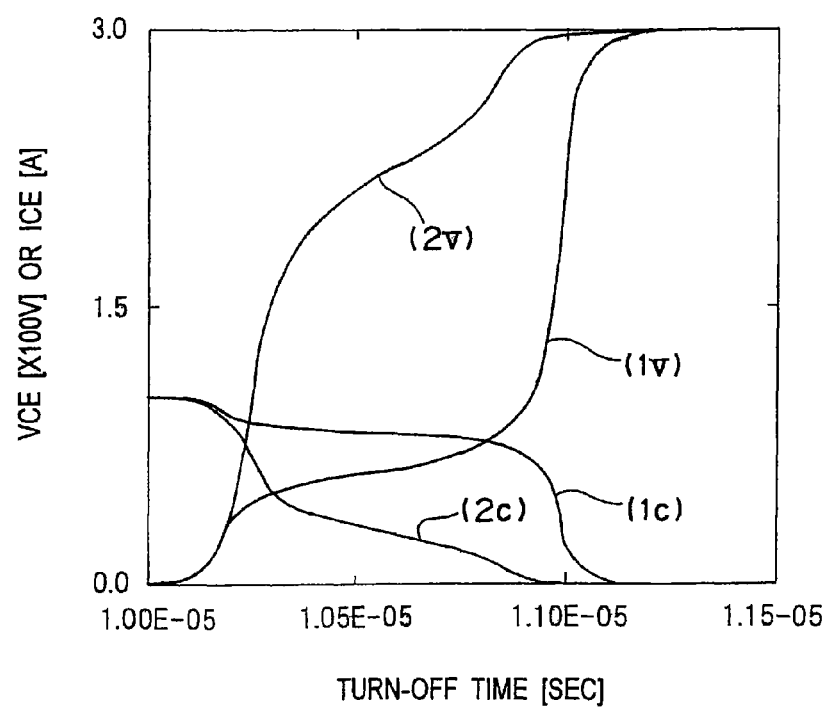
FIG. 12 shows the turn-off waveform of the IGBT according to the embodiment 2 of the present invention.

FIG. 12 shows the turn-off waveform of the IGBT 200. The turn-off time is measured along the horizontal axis and the collector-emitter voltage ($V_{CE}$) or the collector-emitter current ($I_{CE}$) is measured along the vertical axis. In FIG. 12, the symbols ($1_V$) and ($1_C$) denote changes of the $V_{CE}$ value and the $I_{CE}$ value in the IGBT 100 according to the embodiment 1, and the symbols ($2_V$) and ($2_C$) denote changes of the $V_{CE}$ value and the $I_{CE}$ value in the IGBT 200 according to the embodiment 2.

Figure 50:
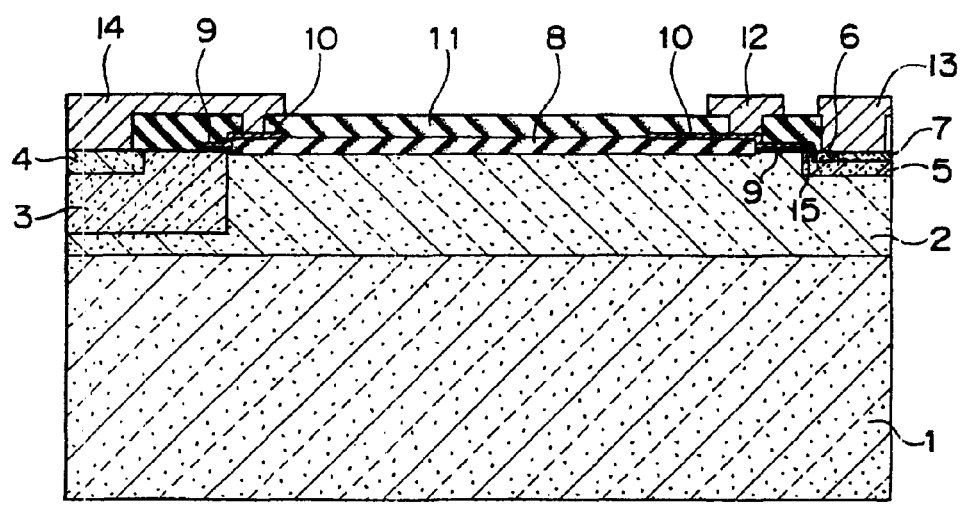
FIG. 50 is a cross sectional view of the conventional IGBT.
Figure 52:
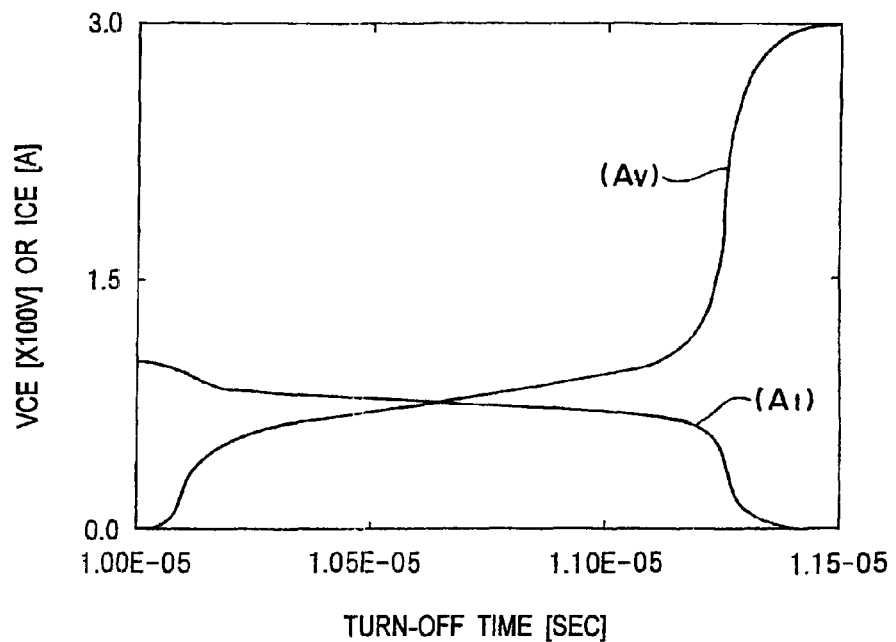
FIG. 52 shows the turn-off waveform of the conventional IGBT.

Although the fall time (tf: the time needed for $I_{CE}$ to come down to 10% from 90% which is the maximum value) has a large value exceeding 1 μs in the IGBT 700 which has the conventional structure shown in FIG. 50, the fall time is approximately 0.5 μs in the IGBT (See (2C).) according to the embodiment 2. The IGBT according to the embodiment 2 thus has a faster switching speed and a smaller switching loss than the conventional IGBT (FIG. 52). In the turn-off waveform as it is upon switching of a resistance load, as $V_{CE}$ rises, $I_{CE}$ decreases at about the same absolute value of falling rate as that of the rising rate of $V_{CE}$.

Figure 13:
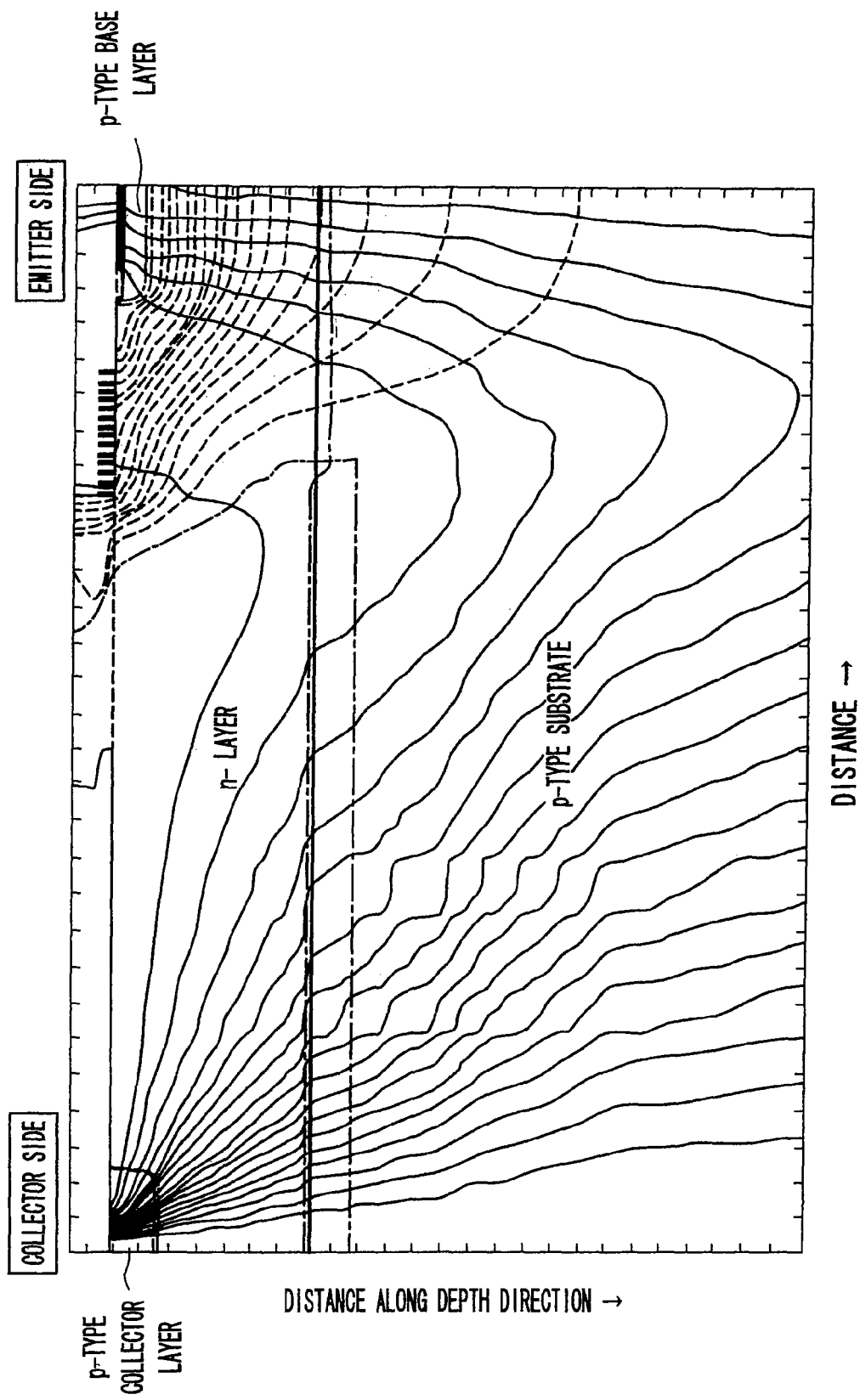
FIG. 13 shows an electric potential distribution, a current distribution, and the boundary line of a depletion region as they are at the time of switching turn-off of a resistance load within the IGBT according to the embodiment 1 of the present invention.

FIG. 13 shows a current distribution (solid lines) and a voltage distribution (dashed lines) and the boundary line of a depletion region (dotted-and-dashed line) as they are at the time of switching turn-off of a resistance load (10.6 μs) within the junction-isolated horizontal IGBT 100 according to the embodiment 1 described above, which drawing corresponds to the cross sectional view in FIG. 1.

In the case of the junction-isolated horizontal IGBT 100, a depletion layer expanding from the emitter side spreads not only to the collector side but even to the p-type substrate, and therefore, the electric potential distribution and the current distribution as well spread to the p-type substrate. This suppresses depletion toward the collector side and makes the $V_{CE}$ increase relatively moderate. As a result, the corresponding $I_{CE}$ decrease as well is relatively moderate.

Figure 14:
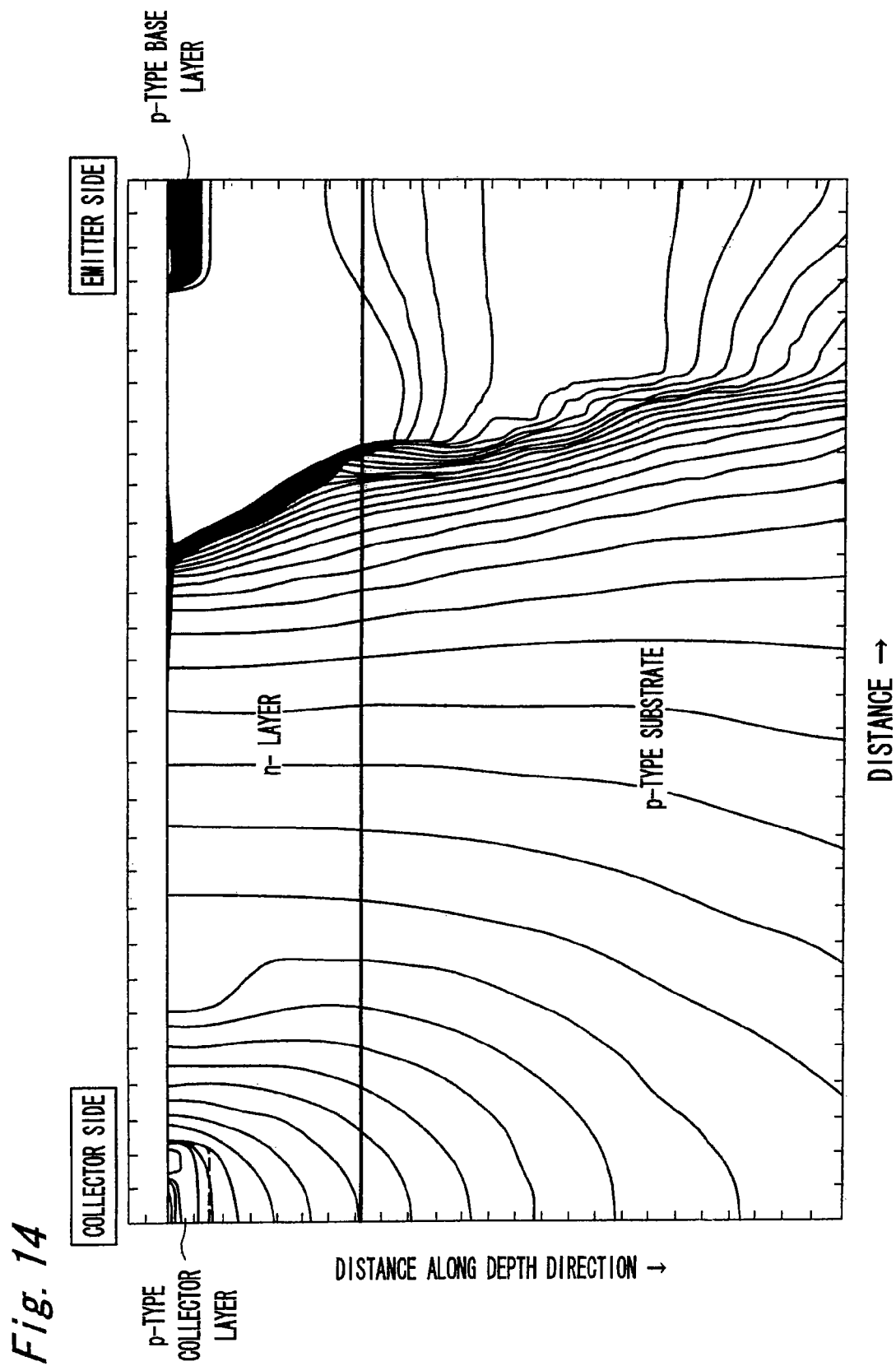
FIG. 14 shows a hole distribution as it is at the time of switching turn-off of a resistance load within the IGBT according to the embodiment 1 of the present invention.

FIG. 14 shows a hole distribution (solid lines) as it is at the time of switching turn-off of a resistance load (10.6 μs) within the junction-isolated horizontal IGBT 100 according to the embodiment 1 described above, which drawing corresponds to the cross sectional view in FIG. 1.

In the junction-isolated horizontal IGBT 100, as shown in FIG. 13, depletion toward the collector side from the emitter side is suppressed, there are numerous holes distributed inside n⁻ layer and the p-type substrate. When there are numerous holes distributed inside n⁻ layer, the p-type substrate and the like, it takes time until the holes disappear and the fall time (tf) becomes relatively long.

Figure 15:
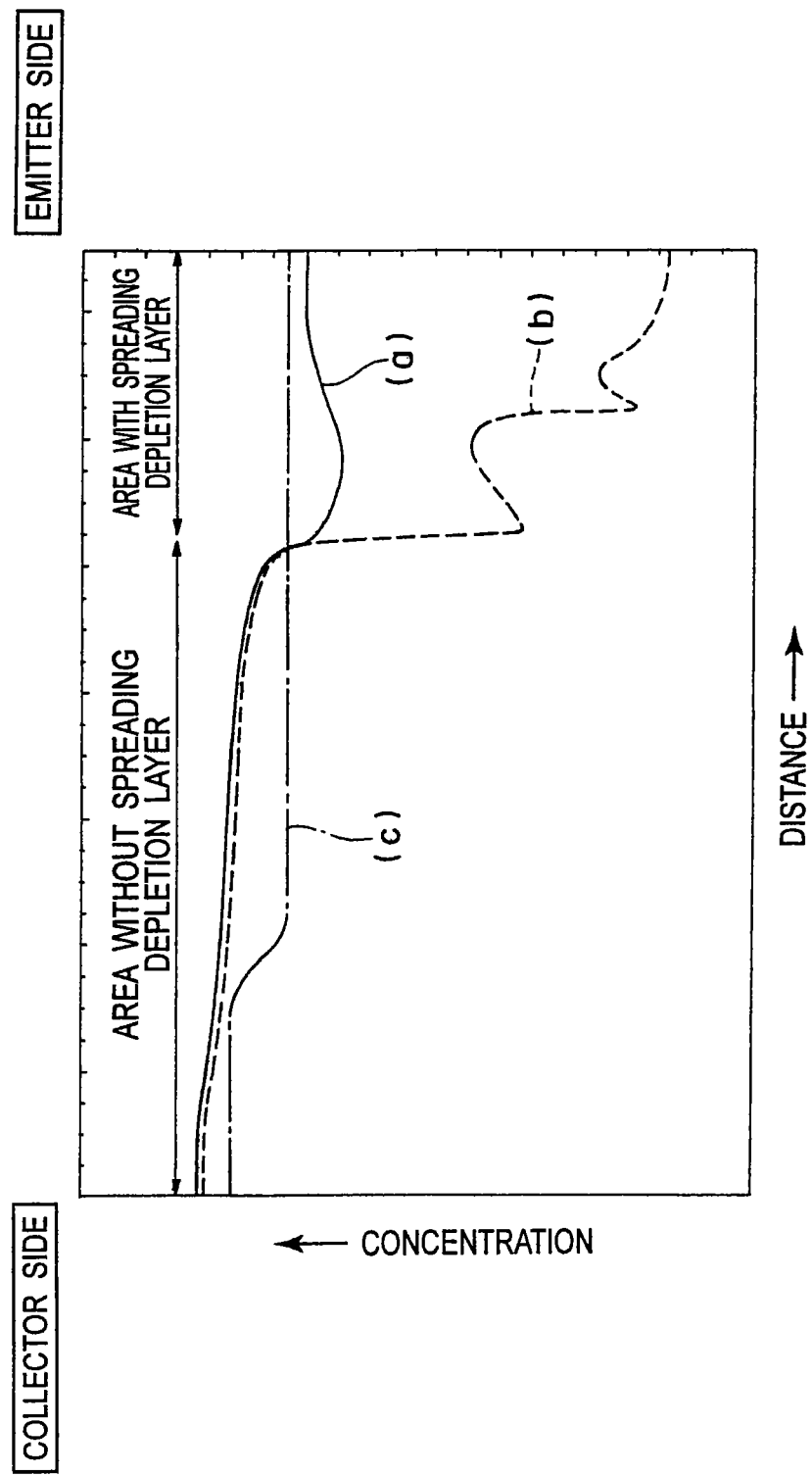
FIG. 15 shows a hole distribution and an electron distribution as they are at the time of switching turn-off of a resistance load, and a concentration as it is in equilibrium within the IGBT according to the embodiment 1 of the present invention.

FIG. 15 shows (a) a hole distribution and (b) an electron distribution at the time of switching turn-off of a resistance load (10.6 μs) and (c) a concentration as it is in equilibrium within the junction-isolated horizontal IGBT 100 according to the embodiment 1 described above, which drawing shows the distributions from the collector side to the emitter side at a constant depth inside n⁻ layer.

As shown in FIG. 13, since depletion toward the collector side from the emitter side is suppressed in the junction-isolated horizontal IGBT 100, the n⁻ layer excessively contains holes and electrons beyond their concentrations in equilibrium. Since there are numerous and excessive holes and electrons within the n⁻ layer, it takes a long time before the excessive holes and electrons disappear from the n layer. Due to this, the fall time (tf) is only slightly faster than in the IGBT 700 which has the conventional structure.

Figure 16:
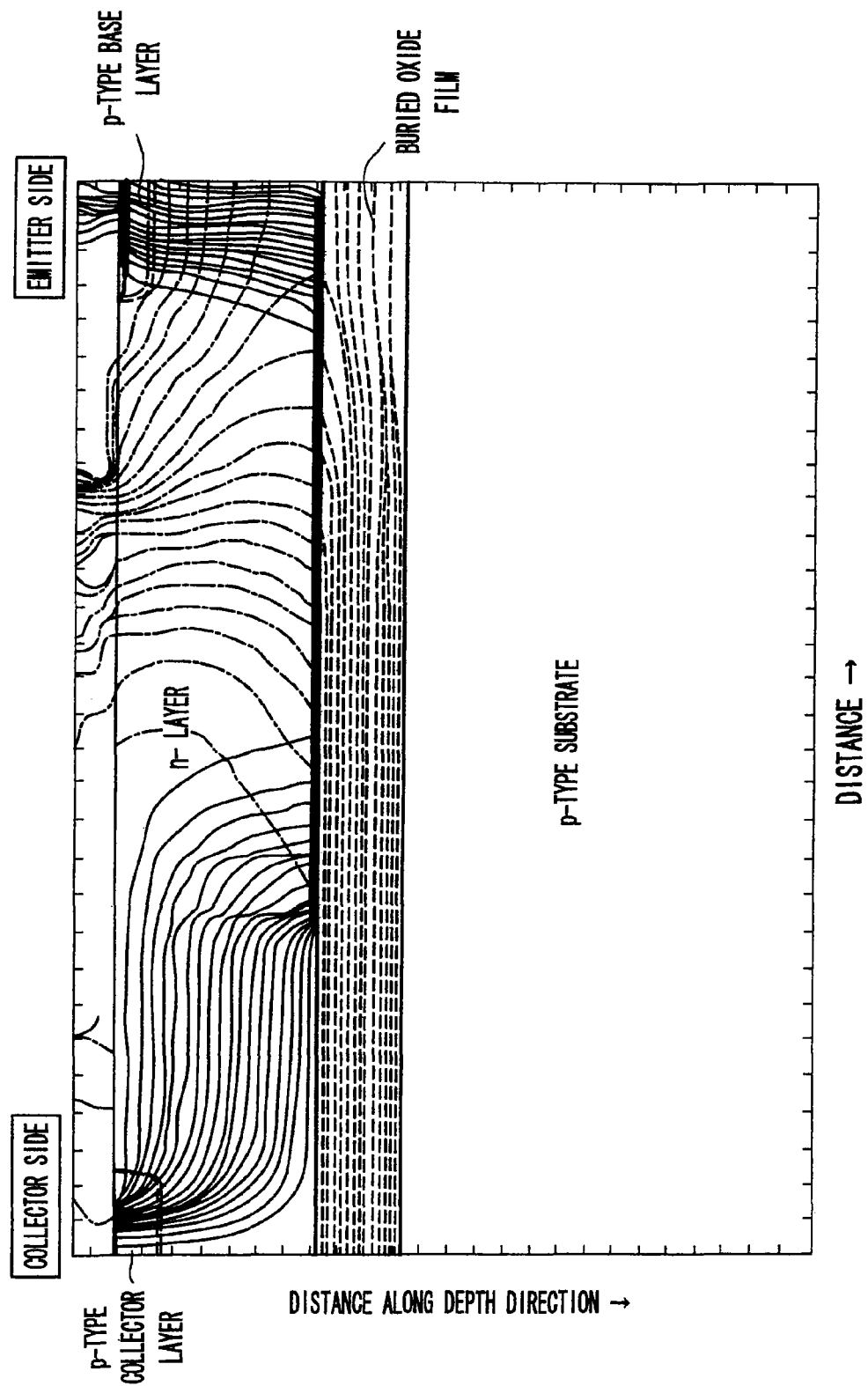
FIG. 16 shows an electric potential distribution, a current distribution, and the boundary line of a depletion region within the IGBT as they are at the time of switching turn-off of a resistance load according to the embodiment 2 of the present invention.

Meanwhile, FIG. 16 shows an electric potential distribution (solid lines), (b) a current distribution (dashed lines) and the boundary line of a depletion region (dotted-and-dashed line) at the time of switching turn-off of a resistance load (10.6 μs) within the dielectric-isolated horizontal IGBT 200 according to the embodiment 2, which drawing corresponds to the cross sectional view in FIG. 10.

In the dielectric-isolated horizontal IGBT 200, due to the buried oxide film present between the n⁻ layer and the p-type substrate, a depletion layer spreading from the emitter side will not expand to the p-type substrate but instead grows toward the collector side within the n⁻ layer. The p-type substrate therefore does not have a current distribution or an electric potential distribution. This encourages depletion toward the collector side, which increases $V_{CE}$. In consequence, the corresponding $I_{CE}$ as well increases, which quickens the fall time (tf).

Figure 17:
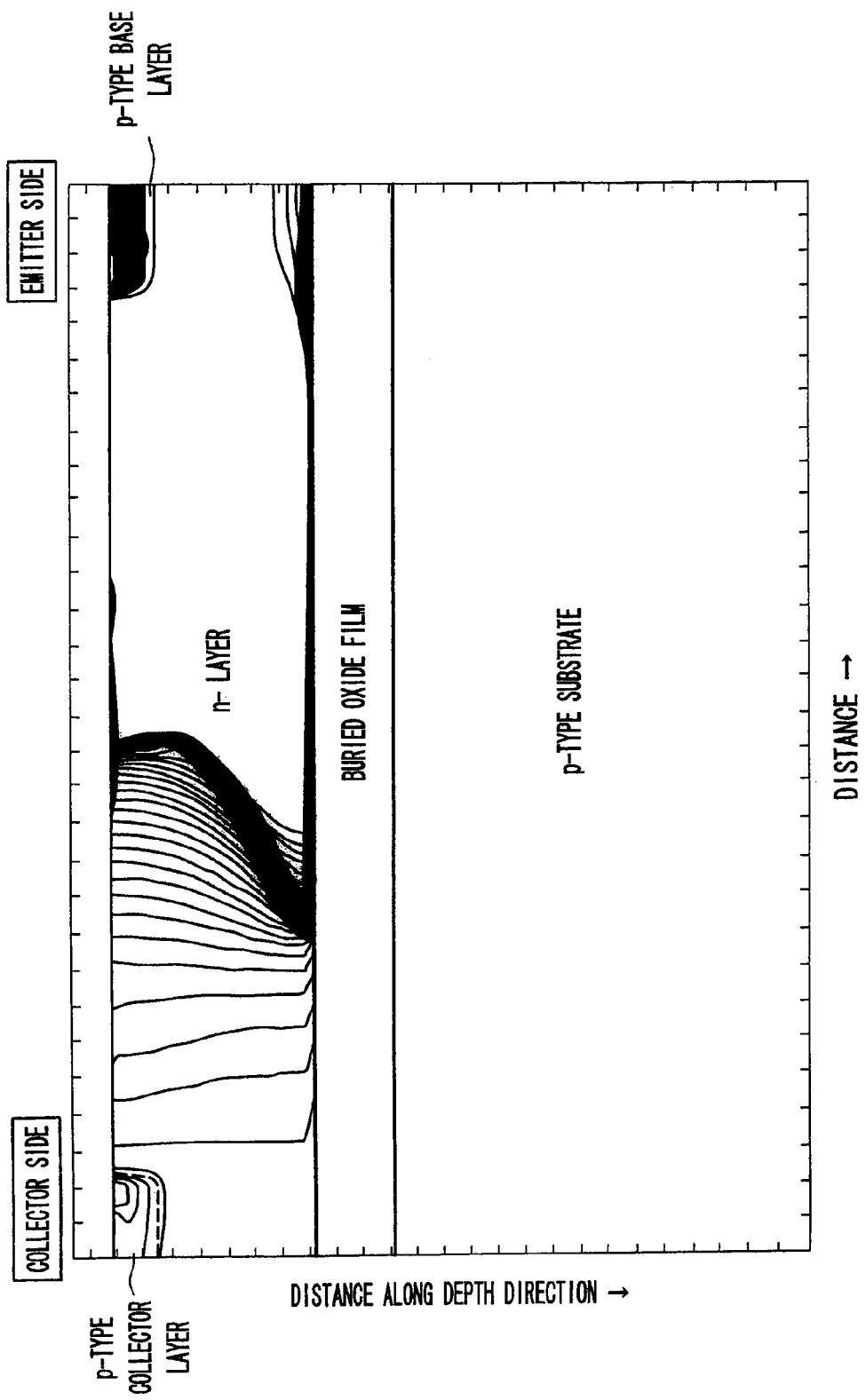
FIG. 17 shows a hole distribution as it is at the time of switching turn-off of a resistance load within the IGBT according to the embodiment 2 of the present invention.

FIG. 17 shows a hole distribution (denoted at the solid lines) as it is at the time of switching turn-off of a resistance load (10.6 μs) within the dielectric-isolated horizontal IGBT 200 according to the embodiment 2, which drawing corresponds to the cross sectional view in FIG. 10.

In the dielectric-isolated horizontal IGBT 200, as shown in FIG. 16, depletion toward the collector side from the emitter side is facilitated, and hence, there are a few holes distributed within the n⁻ layer. Due to this, it takes only a short time before the holes distributed within the n⁻ layer disappear and the fall time (tf) becomes short.

Figure 18:
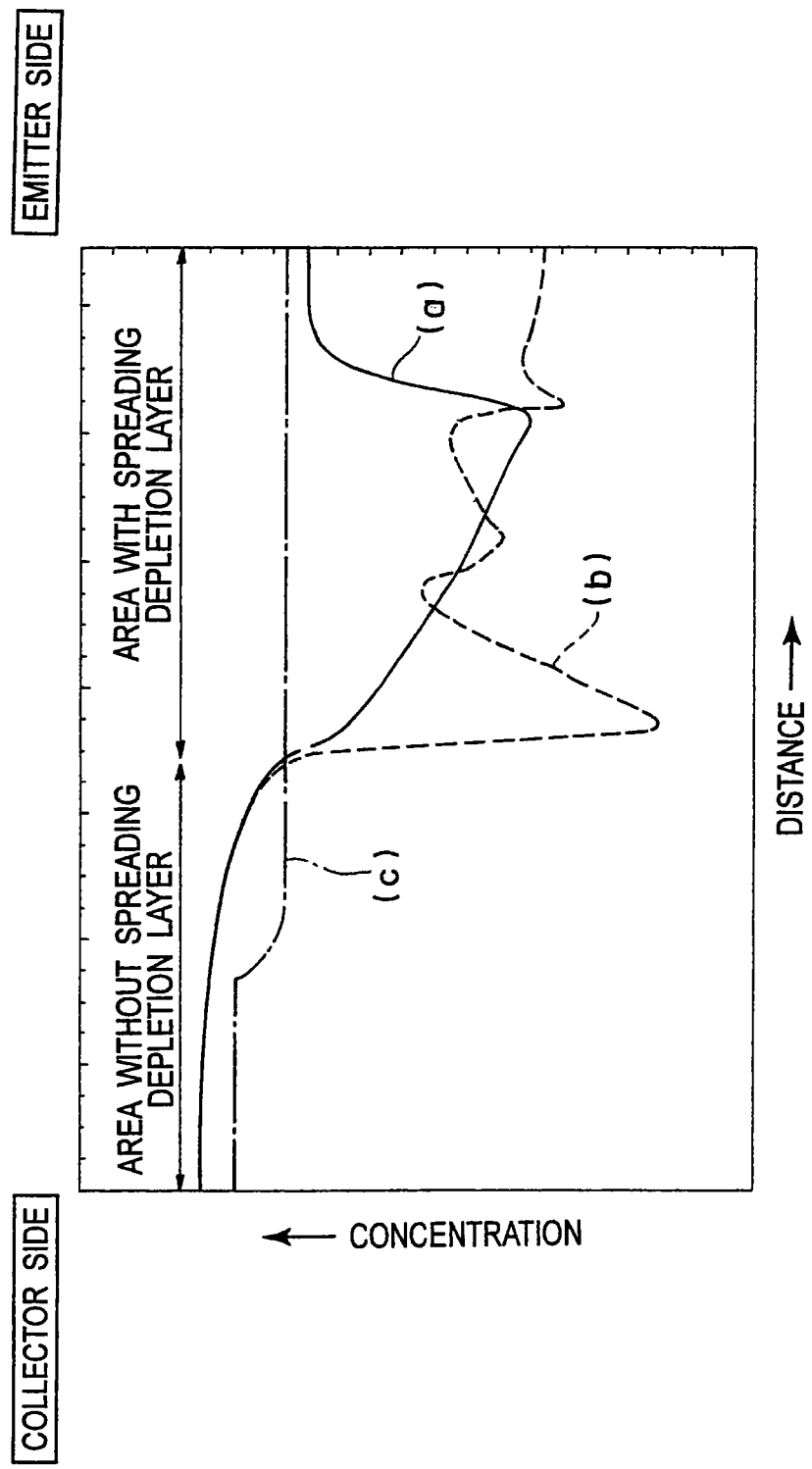
FIG. 18 shows a hole distribution and an electron distribution as they are at the time of switching turn-off of a resistance load, and a concentration as it is in equilibrium within the IGBT according to the embodiment 2 of the present invention.

FIG. 18 shows (a) a hole distribution and (b) an electron distribution at the time of switching turn-off of a resistance load (10.6 μs) and (c) a concentration as it is in equilibrium within the dielectric-isolated horizontal IGBT 200, which drawing shows the distributions from the collector side to the emitter side at a constant depth inside n⁻ layer.

In the dielectric-isolated horizontal IGBT 200, as described above, since depletion toward the collector side from the emitter side is facilitated, an area free from the spreading depletion layer is narrow in the n⁻ layer. Hence, with in the n⁻ layer, there are only a few holes and electrons beyond their concentrations in equilibrium (excessive holes and excessive electrons). When there are only a few excessive holes and electrons in the n⁻ layer, it takes only a short time before the excessive holes and electrons disappear, which quickens the fall time (tf).

The IGBT 200 according to the embodiment 2 thus shortens the fall time (tf), in addition to the improved emitter current ($I_{CE}$) characteristic which is realized by the IGBT 100 according to the embodiment 1.

While FIGS. 16 through 18 refer to the IGBT 200, an approximately similar effect is attained by the IGBT 250 as well.

The structure of disposing the insulation film 20 between the p-type substrate 1 and the n⁻ layer is applicable also to conventional IGBTs.

Embodiment 3

Figure 19:
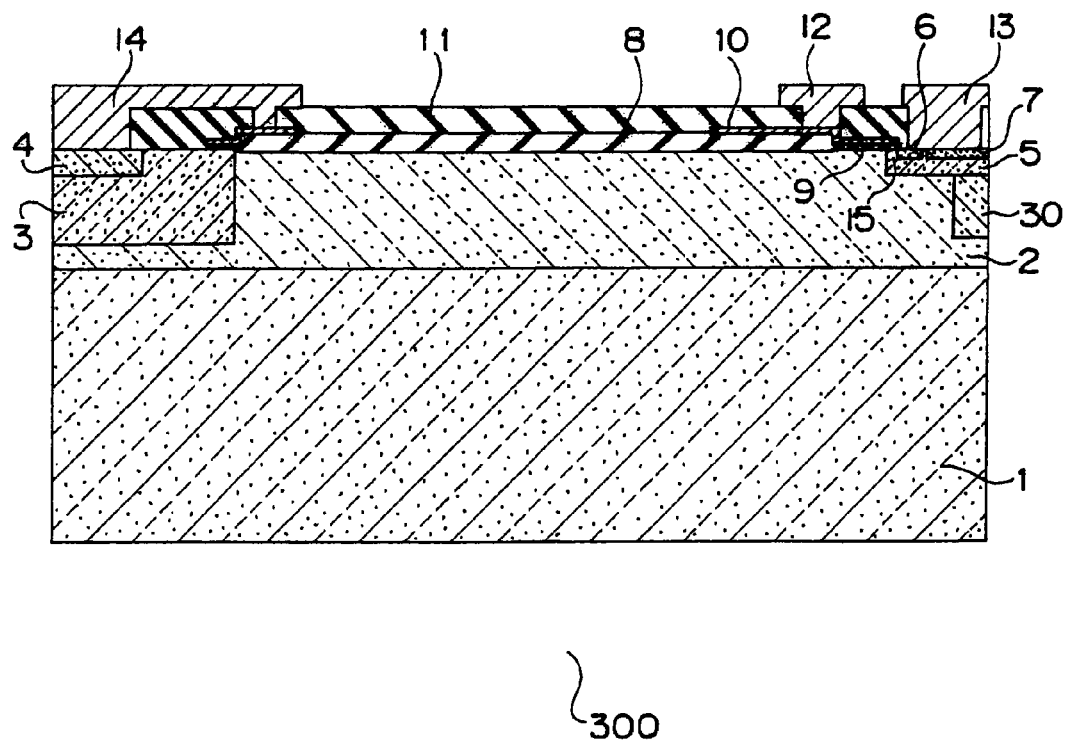
FIG. 19 is a cross sectional view of an IGBT according to a embodiment 3 of the present invention.

FIG. 19 is a cross sectional view of a horizontal n-channel IGBT according to the embodiment 3 of the present invention generally denoted at 300, which is illustration viewed from the same direction as the A-A direction in FIG. 1. In FIG. 19, the same reference symbols as those appearing in FIG. 2 denote the same or corresponding portions.

The IGBT 300 shown in FIG. 19 includes, on the emitter side, a p⁻ layer 30 which is formed narrower and deeper than the p-type base layer 5 but not deep enough to reach the p-type substrate 1 in such a manner that it contacts the bottom surface of the p-type base layer 5. The structure is otherwise the same as that of the IGBT 100 which is shown in FIG. 2.

Figure 20:
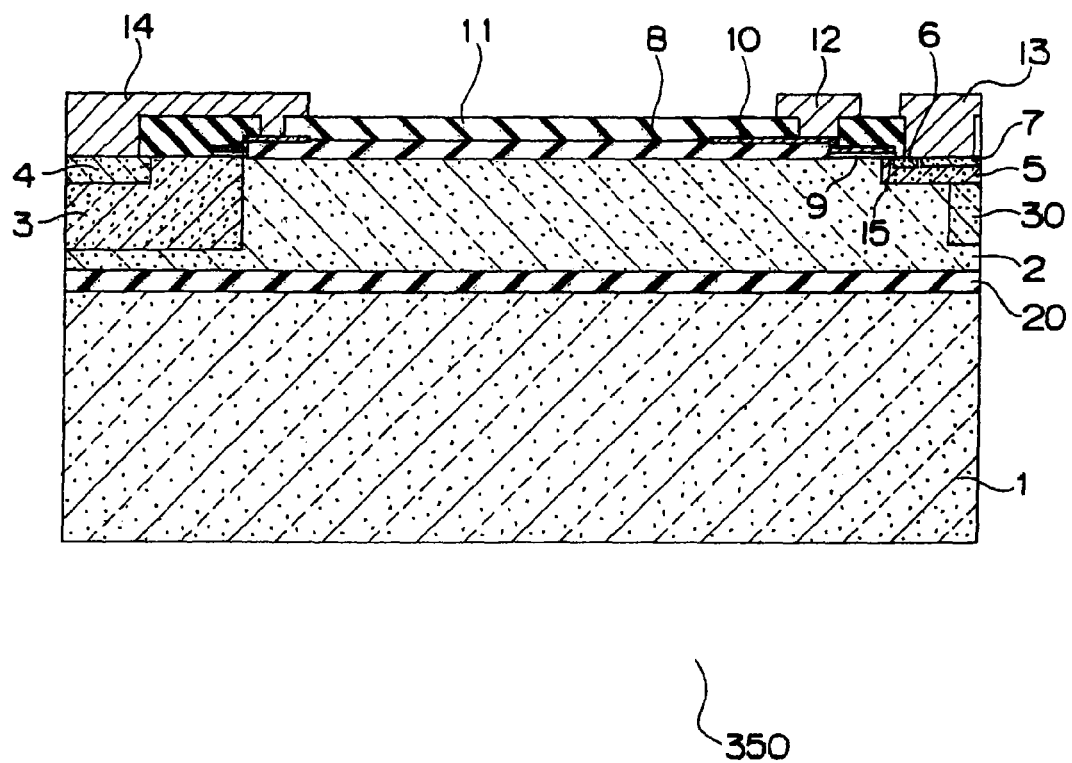
FIG. 20 is a cross sectional view of other IGBT according to the embodiment 3 of the present invention.

FIG. 20 is a cross sectional view of other horizontal n-channel IGBT according to the embodiment 3 of the present invention generally denoted at 350, which is illustration viewed from the same direction as the B-B direction in FIG. 9. In FIG. 20, the same reference symbols as those appearing in FIG. 10 denote the same or corresponding portions.

The IGBT 350 shown in FIG. 20 includes, on the emitter side, a p⁻ layer 30 whose width (the length along the right-to-left direction in FIG. 20) is narrower and which is deeper than the p-type base layer 5 but not deep enough to reach the buried insulation film 20 in such a manner that it contacts the bottom surface of the p-type base layer 5. The structure is otherwise the same as that of the IGBT 200 which is shown in FIG. 10.

Figure 21:
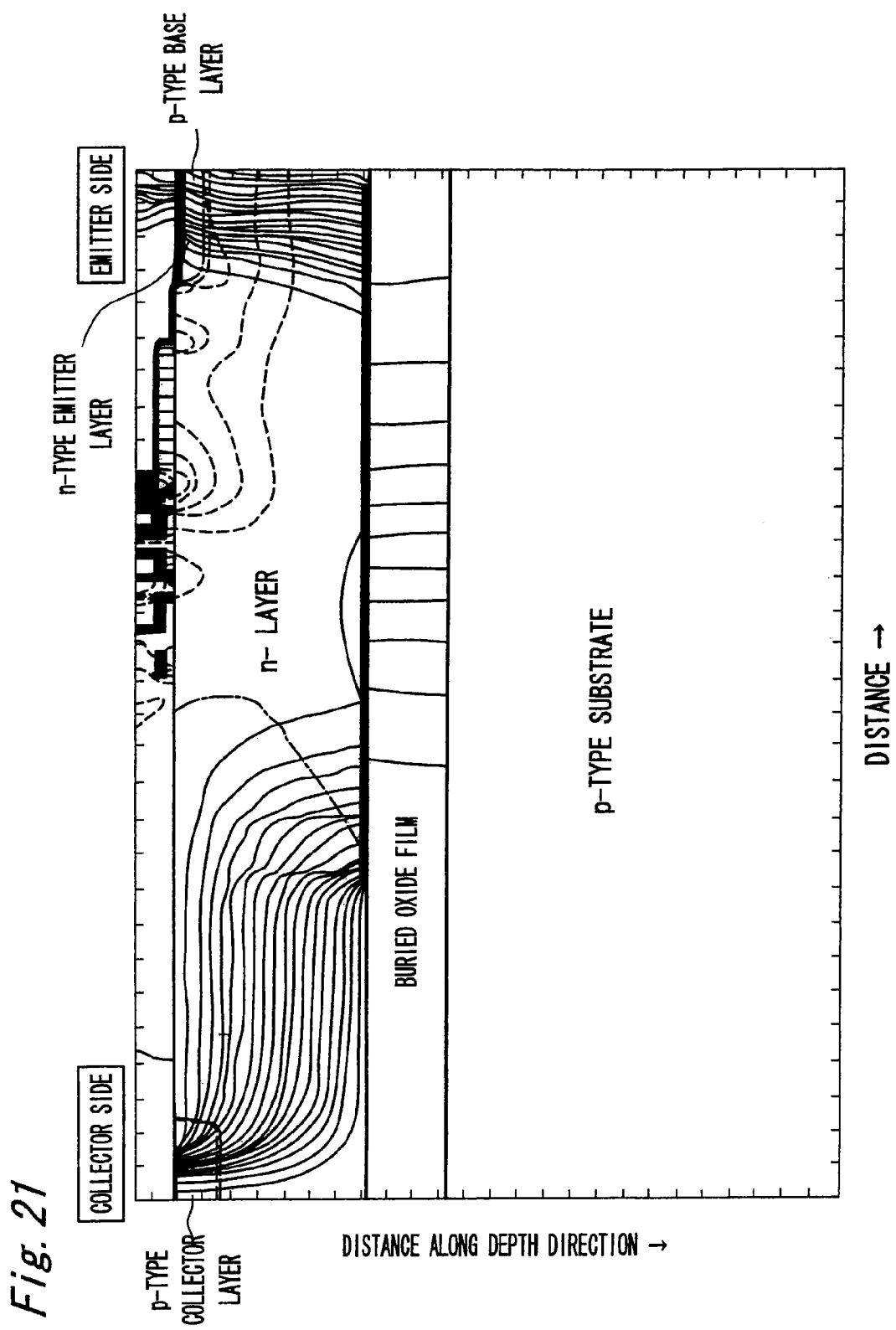
FIG. 21 shows an electric field distribution, a current distribution, and the boundary line of a depletion region within the IGBT as they are at the time of switching turn-off of a resistance load according to the embodiment 2 of the present invention.

FIG. 21 shows a current distribution (solid lines), an electric field distribution (dashed lines) and the boundary line of a depletion region (dotted-and-dashed line) as they are at the time of switching turn-off of a resistance load (10.6 µs) within the dielectric-isolated horizontal IGBT 200 according to the embodiment 2, which drawing corresponds to the cross sectional view in FIG. 10.

Figure 22:
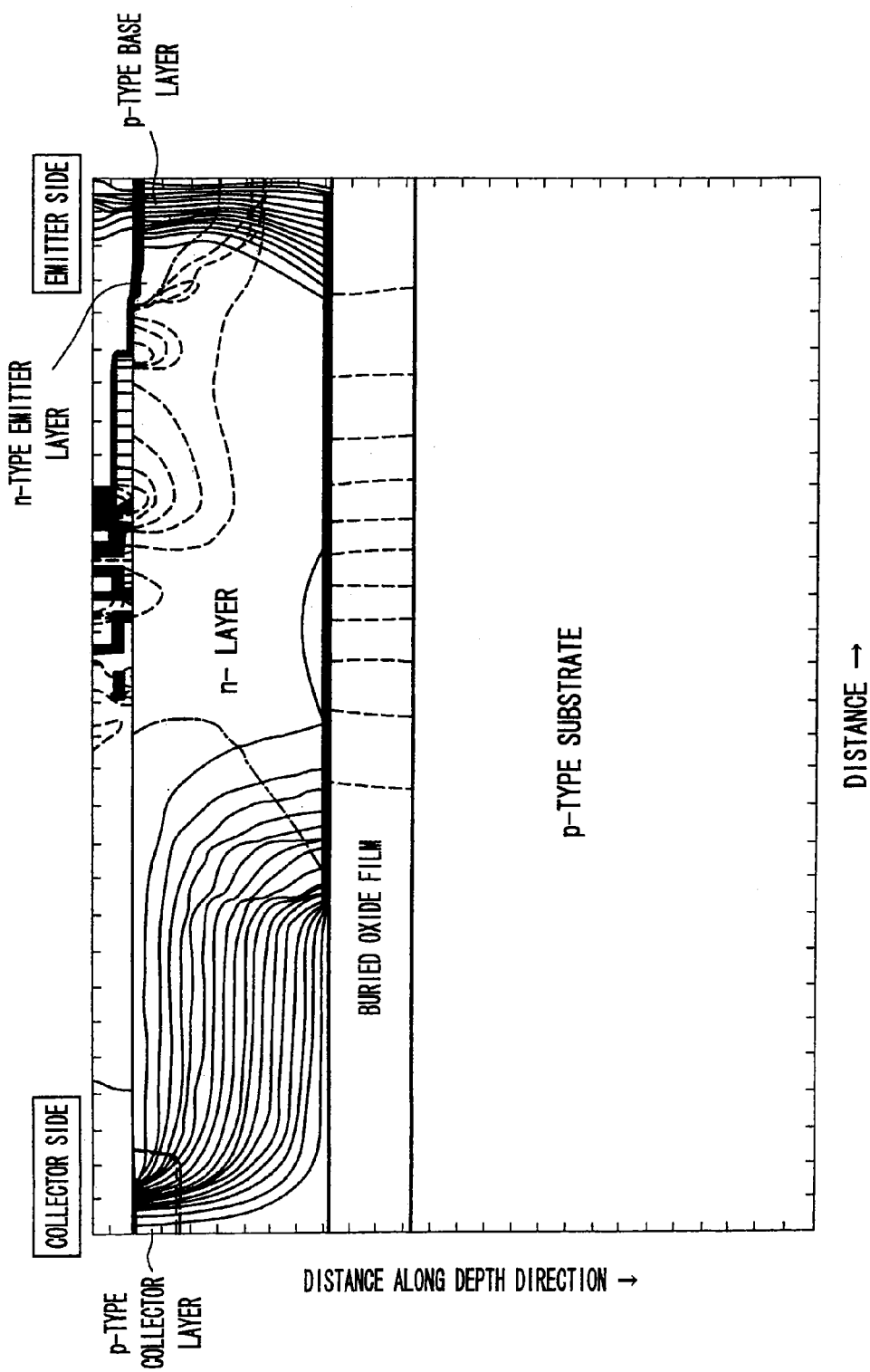
FIG. 22 shows an electric field distribution, a current distribution, and the boundary line of a depletion region within the IGBT as they are at the time of switching turn-off of a resistance load according to the embodiment 3 of the present invention.

Meanwhile, FIG. 22 shows a current distribution (solid lines) and an electric field distribution (dashed lines) as they are at the time of switching turn-off of a resistance load (10.6 µs) and the boundary line of a depletion region (dotted-and-dashed line) within the dielectric-isolated horizontal IGBT 350 according to the embodiment 3, which drawing corresponds to the cross sectional view in FIG. 20.

One can tell from FIG. 21 that in the dielectric-isolated structure including the buried insulation film, the current flows through the n⁻ layer which is right above the buried oxide film.

Noting this, the p⁻ layer may be disposed in a lower section of the p-type base layer, to thereby permit the hole current arriving at the n⁻ layer on the emitter side easily flow into a section developing a high electric field at the bottom of the p⁻ layer.

FIG. 22 of the IGBT 350 shows that the hole current flowing immediately below the n-type emitter layer is less than in the IGBT 250 (FIG. 21). In consequence, a parasitic thyristor will not easily operate in the IGBT 350 unlike in the IGBT 250, which improves the latch-up tolerance.

Further, the width of the p⁻ layer is narrower than the p-type base layer in the IGBT 350. Due to this, the hole current arriving at the n⁻ layer on the emitter side flows approximately upward within the p⁻ layer to the emitter electrode, which shortens the fall time (tf) than in the IGBT 250 which does not include the p⁻ layer.

As described above, in the IGBTs 300 and 350 according to this embodiment, the p⁻ layer formed in the lower section of the p-type base layer prevents latching-up of a parasitic thyristor and shortens the fall time (tf). This effect is remarkable particularly in the case of the IGBT 350 including the buried insulation film in particular.

The structure that the p⁻ layer is formed in the lower section of the p-type base layer may be applied to a conventional IGBT to achieve a similar effect.

Embodiment 4

Figure 23:
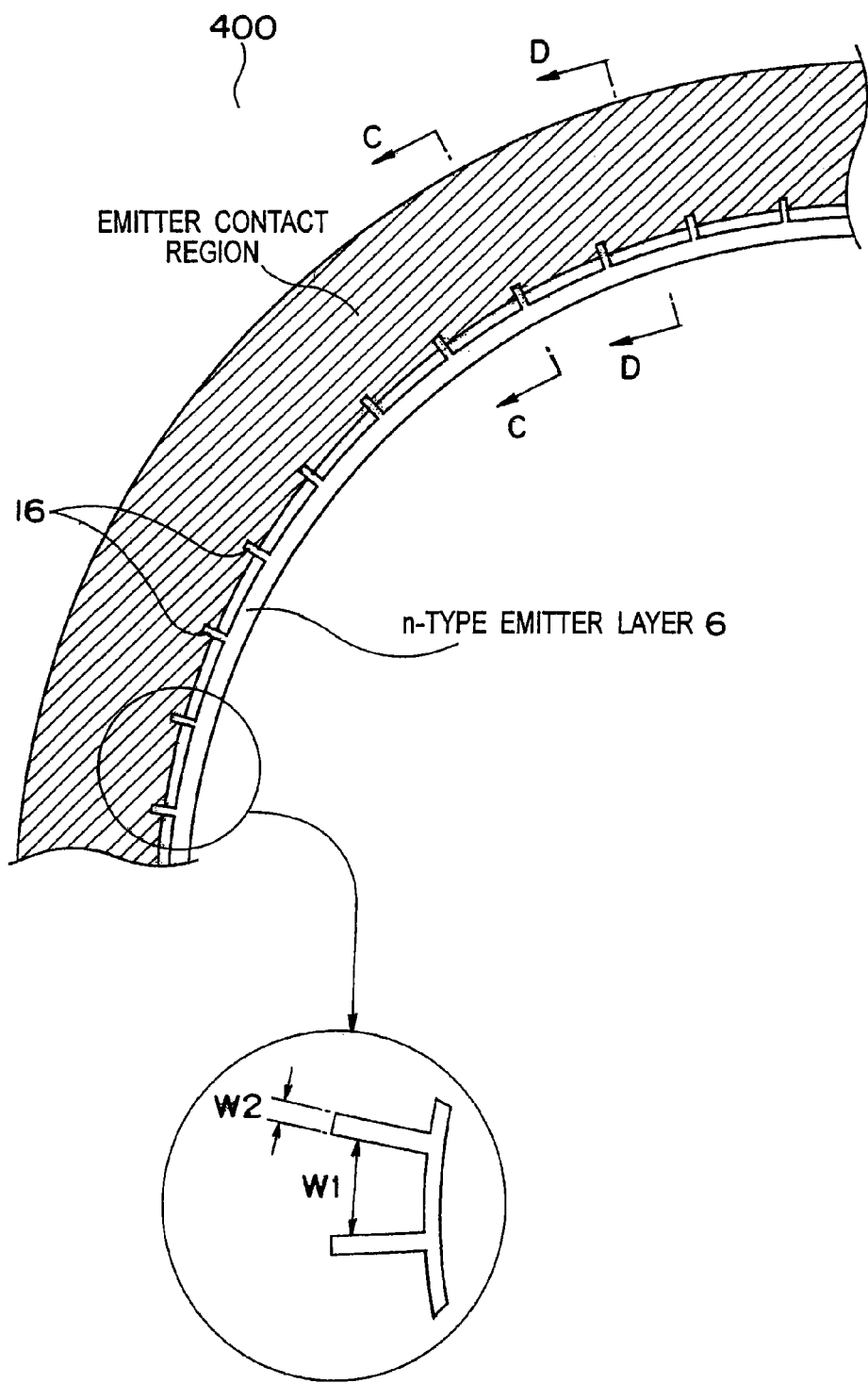
FIG. 23 is a top view of a part of an IGBT according to an embodiment 4 of the present invention.

FIG. 23 is a top view of a part of a horizontal n-channel IGBT according to the embodiment 4 of the present invention generally denoted at 400, showing the n-type emitter (n⁺) layer 6 formed within the p-type base layer 5 (a connection region with an emitter electrode (emitter contact region)).

As shown in FIG. 23, the n-type emitter layer 6 includes multiple outwardly protruding projections (convex areas) 16 in the IGBT 400. As shown in FIG. 23, the relationship W1>W2 holds between the width of the projections 16 (W2) and the gap between the neighboring projections 16 (W1). The structure is otherwise the same as that of the IGBT 100 described earlier.

Figure 24:
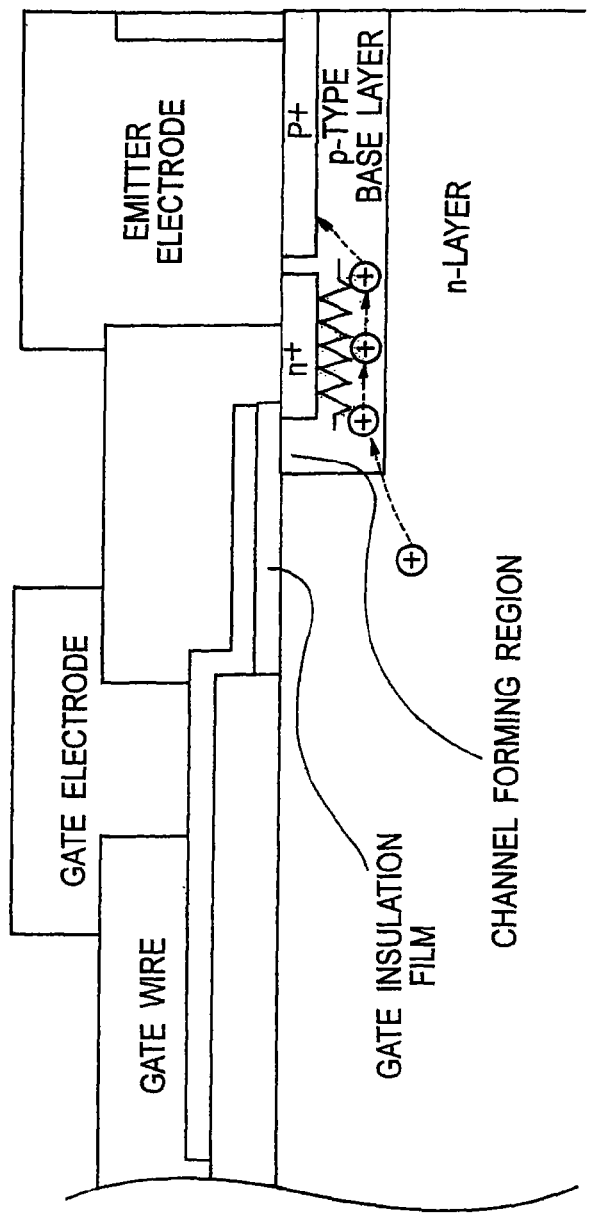
FIG. 24 is a cross sectional view of the IGBT according to the embodiment 4 of the present invention.
Figure 25:
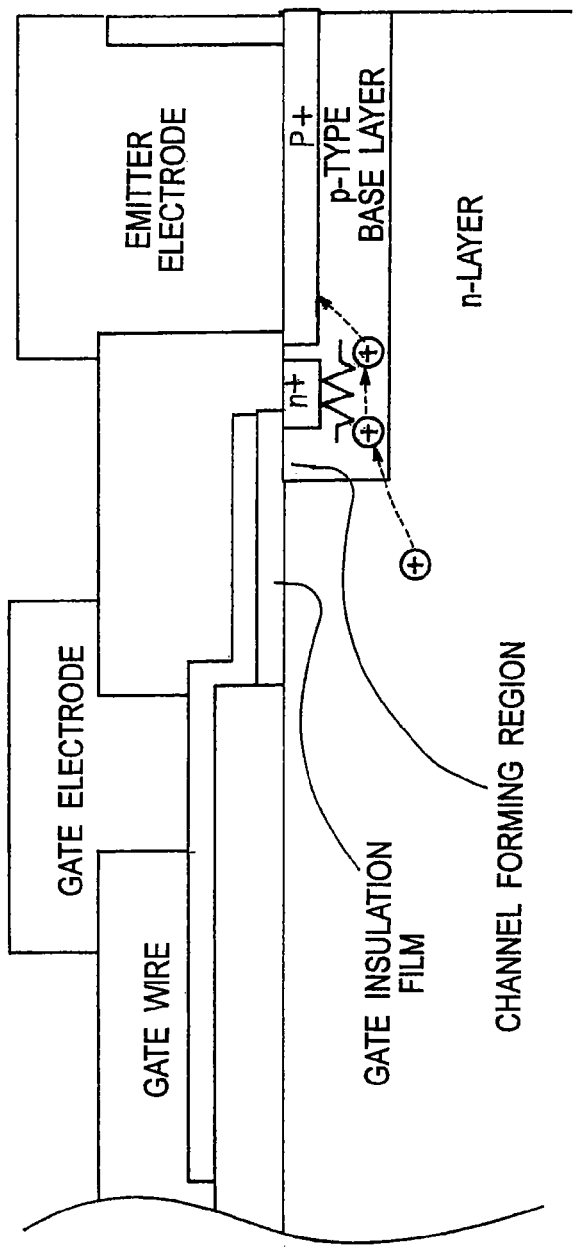
FIG. 25 is a cross sectional view of the IGBT according to the embodiment 4 of the present invention.

FIG. 24 is a cross sectional view of FIG. 23 taken along the direction C-C, and FIG. 25 is a cross sectional view of FIG. 23 taken along the direction D-D. FIGS. 24 and 25 also show the flows of holes as they are upon turning off of the IGBT and during the steady ON-state.

The width of the n-type emitter layer in the cross sectional view in FIG. 24 is approximately equal to the width of the n-type emitter layer of the IGBT 100 shown in FIG. 1. Meanwhile, the width of the n-type emitter layer in the cross sectional view in FIG. 25 is narrower than the width of the n-type emitter layer 6 of the IGBT 100 shown in FIG. 1.

In FIG. 25, since the width of the n-type emitter (n⁺) is narrow, the width of the p-type base layer right under the n-type emitter layer of a parasitic npn bipolar transistor formed by the n⁻ layer/the p-type base layer/the n-type emitter layer is narrow, and the base resistance of the p-type base region is low. This suppresses an operation of the parasitic npn bipolar transistor and prevents latching-up of a parasitic thyristor formed by the p-type collector layer/the n-type buffer layer/the n⁻ layer/the p-type base layer/the n-type emitter layer.

Thus, at the time of turning off or during the steady ON-state of the IGBT 400 according to the embodiment 4, the latch-up tolerance of a parasitic thyristor improves in the IGBT.

Further, in the IGBT 400, the projections 16 are portions of the n-type emitter layer 6 and the both are connected electrically with each other, and hence, use of this structure will not reduce the channel width than in the IGBT 100. For this reason, the collector-emitter current ($I_{CE}$) characteristic upon application of the collector-emitter voltage ($V_{CE}$) in a condition that the constant gate-emitter voltage ($V_{GE}$) is applied is excellent as in the IGBT 100.

Figure 26:
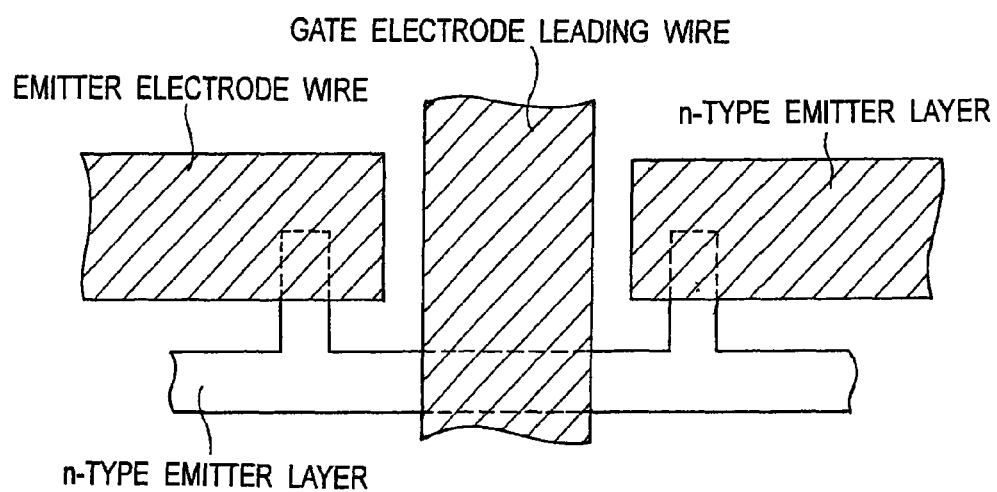
FIG. 26 is a top view of a part of the IGBT according to the embodiment 4 of the present invention.

In addition, the n-type emitter layer has the projections and their sizes satisfy the relationship W1>W2 (FIG. 23) in the IGBT 400. In short, with a gate electrode leading wire disposed between two projections as shown in FIG. 26 makes it unnecessary to sever the n-type emitter layer which intersects gate electrode leading wires as in the conventional structure. This permits disposing gate electrode leading wires without reducing the channel width.

Hence, the collector-emitter current ($I_{CE}$) characteristic upon application of the collector-emitter voltage ($V_{CE}$) in a condition that the constant gate-emitter voltage ($V_{GE}$) is applied is excellent The n-type emitter layer having such a structure is applicable also to a conventional IGBT.

FIG. 27 is a top view which shows the arrangement of the p-type emitter layer (denoted at the symbol "p⁺" in FIGS. 24 and 25) vis-à-vis the n-type emitter layer in the horizontal n-channel IGBT shown in FIG. 23.

Figure 27A:
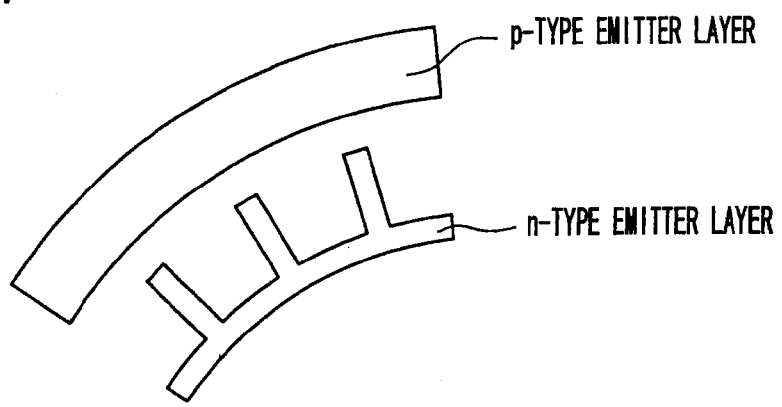
FIG. 27 is a top view which shows the arrangement of a p-type emitter layer in the IGBT according to the embodiment 4 of the present invention.
Figure 27B:
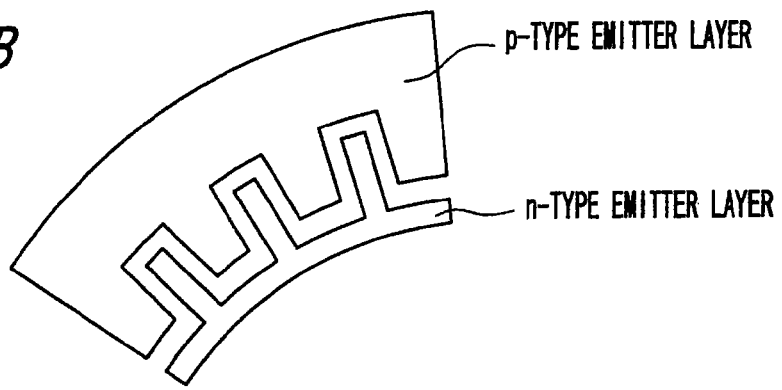
Figure 27C:
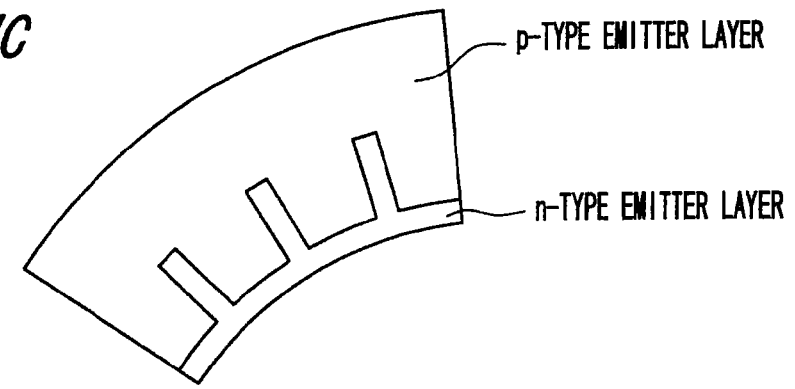

As shown in FIG. 27A, the p-type emitter layer may be shaped like a stripe which surrounds the n-type emitter layer. Alternatively, as shown in FIGS. 27A and 27B, the p-type emitter layer may be shaped like a ring which is along the n-type emitter layer. Shown in FIG. 27 is the shape in which there is a predetermined gap between the p-type emitter layer and the n-type emitter layer, while shown in FIG. 27C is the shape in which the p-type emitter layer and the n-type emitter layer contact each other.

Figure 27D:
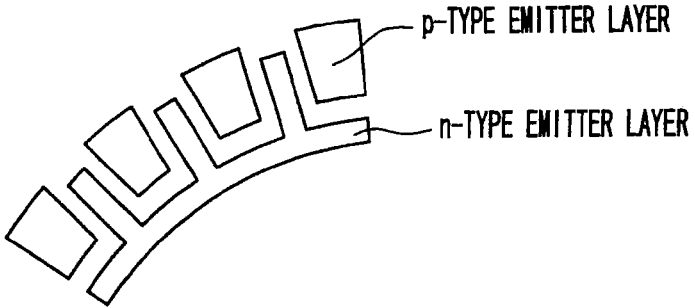

Further, alternatively, as shown in FIG. 27D, the p-type emitter layer may be discontinuous along the n-type emitter layer.

Such a configuration of the p-type emitter layer is applicable also to the p-type emitter layers of the other embodiments.

Embodiment 5

Figure 28:
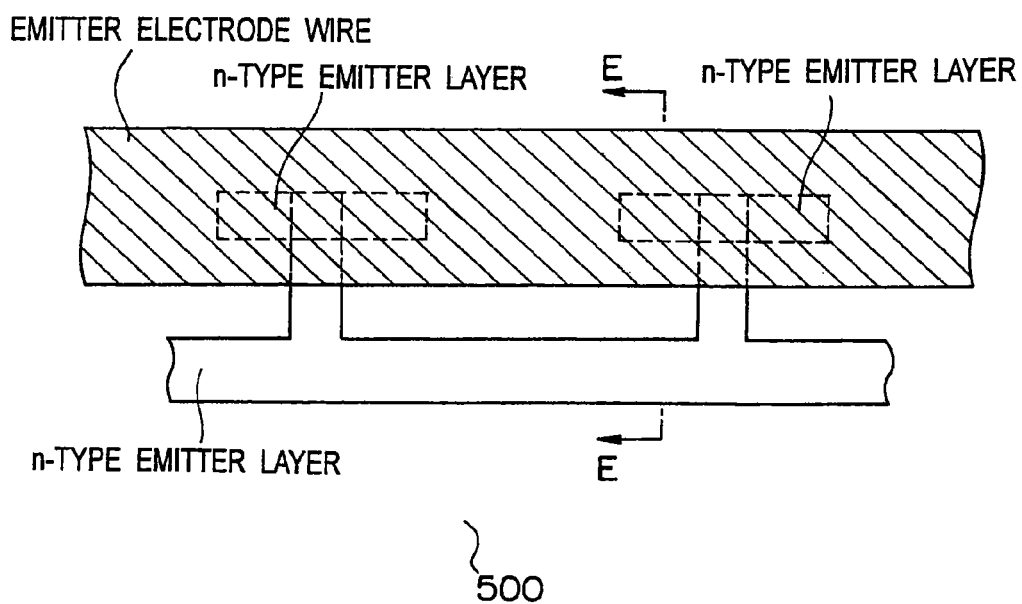
FIG. 28 is a top view of a part of an IGBT according to an embodiment 5 of the present invention.
Figure 29:
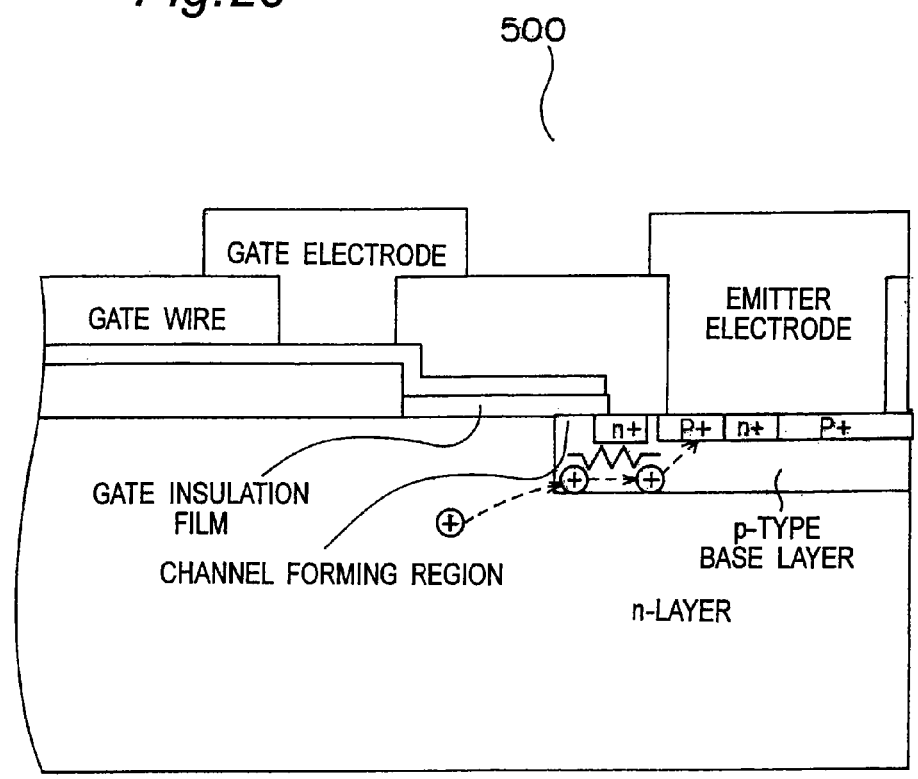
FIG. 29 is a cross sectional view of the IGBT according to the embodiment 5 of the present invention.

FIG. 28 is a top view of a part of a horizontal n-channel IGBT according to the embodiment 5 of the present invention generally denoted at 500, showing a connection region (emitter contact region) between the n-type emitter layer and the emitter electrode. FIG. 29 is a cross sectional view of the IGBT 500 shown in FIG. 28 taken along the direction E-E.

As shown in FIG. 28, in the IGBT 500 according to the embodiment 5, the projections of the n-type emitter layer have T-shaped tips in addition to what the IGBT 400 (FIG. 25) includes, which increases the size of the area where the n-type emitter layer and emitter electrode wires contact each other. The structure is otherwise the same as the IGBT 400.

The n-type emitter layer newly disposed in the IGBT 500 is formed to have a narrow width (the length along the horizontal direction in FIG. 29) as shown in FIG. 29. This lowers the base resistance in the p-type base region right under the n-type emitter layer in a parasitic npn bipolar transistor formed by the n⁻ layer/the p-type base layer/the n-type emitter layer. This suppresses an operation of the parasitic npn bipolar transistor and prevents latching-up of a parasitic thyristor formed by the p-type collector layer/the n-type buffer layer/the n⁻ layer/the p-type base layer/the n-type emitter layer. In consequence, at the time of turning off or during the steady ON-state of the horizontal n-channel IGBT 500, the latch-up tolerance of a parasitic thyristor improves in the IGBT.

Further, in the IGBT 500, since the area where the n-type emitter layer and emitter electrode wires contact each other expands, the contact resistance between the n-type emitter layer and the emitter electrode wires is small.

As described above, in the horizontal n-channel IGBT 500 according to the embodiment 5, the projections of the n-type emitter layer are T-shaped unlike in the IGBT according to the embodiment 4, which increases the size of the area where the n-type emitter layer and the emitter electrode wires contact each other and reduces the contact resistance between the n-type emitter layer and the emitter electrode wires. The result of this is an improved collector-emitter current ($I_{CE}$) characteristic upon application of the collector-emitter voltage ($V_{CE}$) in a condition that the constant gate-emitter voltage ($V_{GE}$) is applied.

The n-type emitter layer having this structure is applicable also to a conventional IGBT.

Embodiment 6

Figure 30:
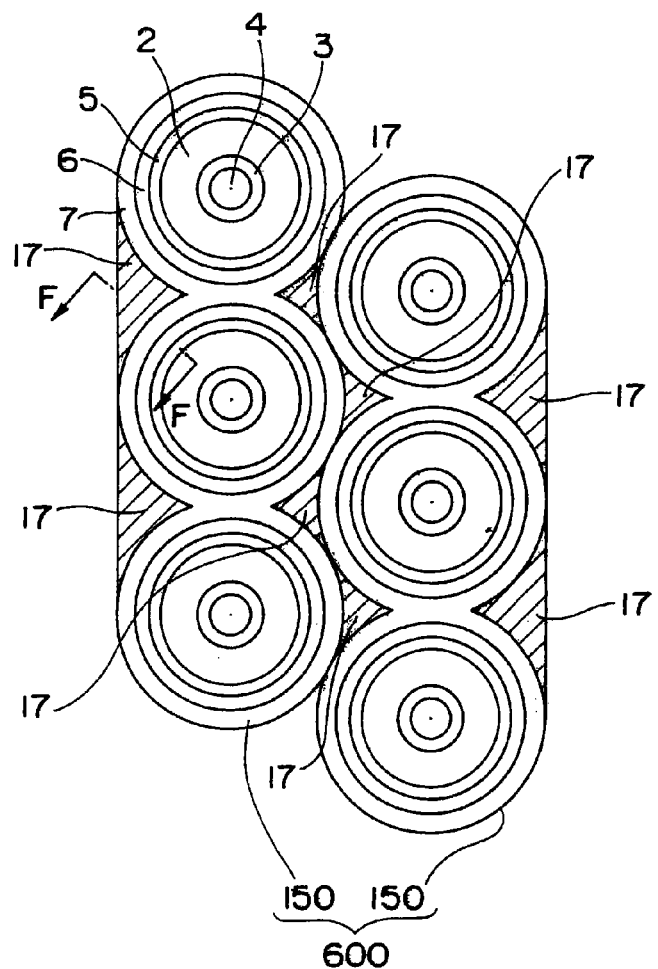
FIG. 30 is a top view of an IGBT according to an embodiment 6 of the present invention.
Figure 31:
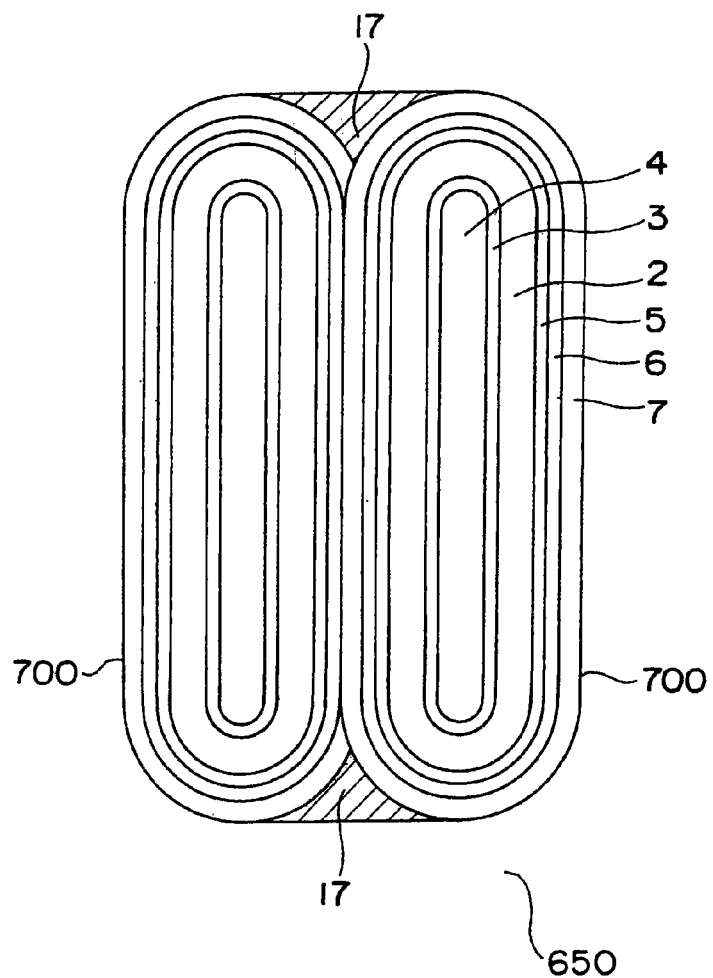
FIG. 31 is a top view of another IGBT according to the embodiment 6 of the present invention.
Figure 32:
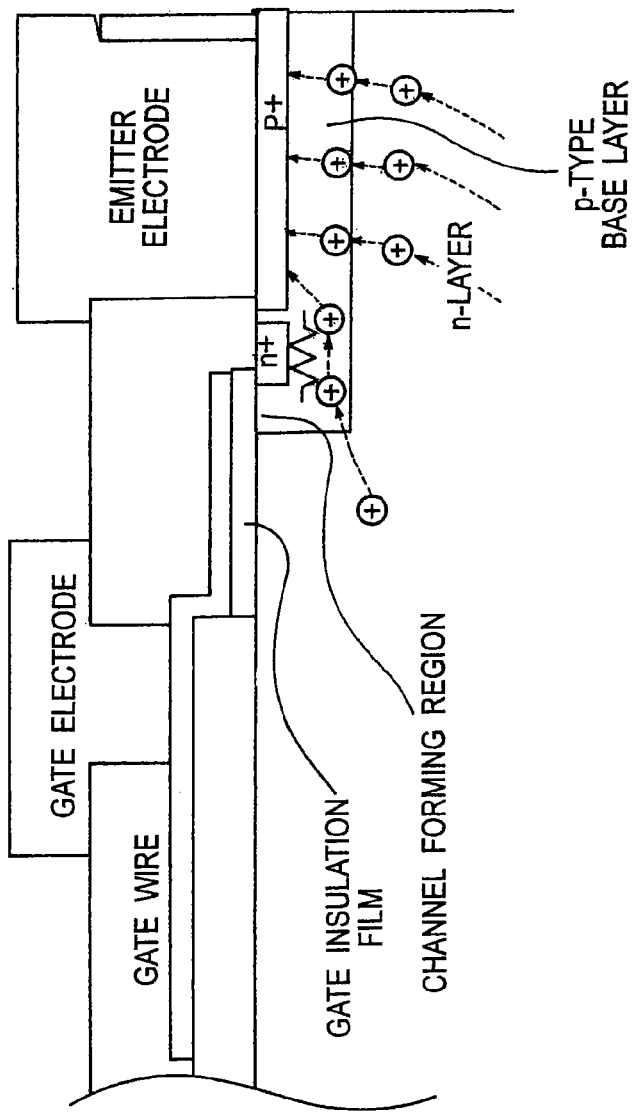
FIG. 32 is a cross sectional view of the IGBT according to the embodiment 6 of the present invention.

FIG. 30 is a top view is an IGBT generally denoted at 600 which is a combination of two IGBTs 150 according to the embodiment 1. FIG. 31 is a top view is an IGBT generally denoted at 650 which is a combination of two IGBTs 700. FIG. 32 is a cross sectional view of the IGBT 600 of FIG. 30 taken along the direction F-F. In FIGS. 30 and 31, the same reference symbols as those used in FIGS. 2 and 3 denote the same or corresponding portions.

As denoted at the shade lines in FIGS. 30 and 31, in the IGBTs 600 and 650 according to the embodiment 6, there are p-type emitter layers 17 disposed in areas between a common contact line to adjacent two unit IGBTs and two IGBTs and areas enclosed by three adjacent unit IGBTs, which expands the area sizes of the contact between the p-type emitter layers and the emitter electrode wires.

In this structure, the p-type emitter layers 7 and 17 are relatively wider than the n-type emitter layer 6. This reduces the contact resistance between the p-type emitter layers 7 and 17 and emitter wires, and ensures a smooth flow of holes to the contact region, where the p-type emitter (p⁺) layers and the emitter wires (emitter electrode) contact, without becoming stagnant immediately below the n-type emitter layer as shown in FIG. 32. An indirect reason behind this is the reduced base resistance at the p-type base region right under the n-type emitter layer.

This suppresses an operation of a parasitic npn bipolar transistor formed by the n⁻ layer/the p-type base layer/the n-type emitter layer and prevents latching-up of a parasitic thyristor formed by the p-type collector layer/the n-type buffer layer/the n⁻ layer/the p-type base layer/the n-type emitter layer. In consequence, at the time of turning off or during the steady ON-state of the horizontal n-channel IGBT 600, the latch-up tolerance of a parasitic thyristor improves in the IGBT.

Embodiment 7

Figure 33:
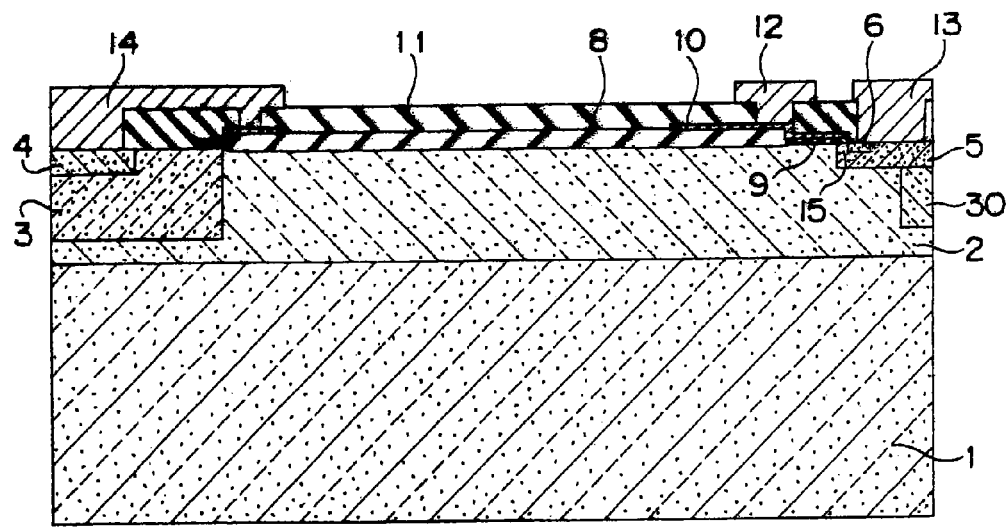
FIG. 33 is a cross sectional view of an IGBT according to a embodiment 7 of the present invention.

FIG. 33 is a cross sectional view of a horizontal n-channel IGBT according to the embodiment 7 of the present invention generally denoted at 1100, which is illustration viewed from the same direction as the A-A direction in FIG. 1. In FIG. 33, the same reference symbols as those appearing in FIG. 19 denote the same or corresponding portions.

As compared to the IGBT 300 according to the embodiment 3 (FIG. 19), the IGBT 1100 according to the embodiment 7 (FIG. 33) has a structure which does not include the p-type emitter layers 7, except for which the structure is the same as that of the IGBT 300. In the IGBT 1100, there is no p-type emitter, but instead the p-type base layer 5 has a structure which serves also as a p-type emitter.

Figure 34:
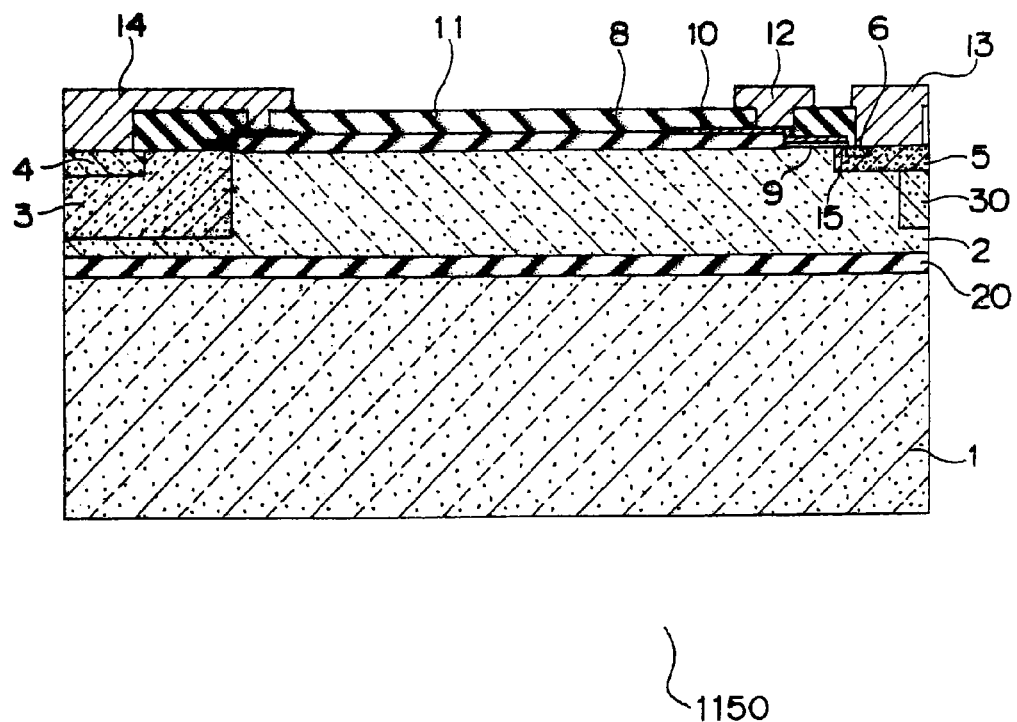
FIG. 34 is a cross sectional view of another IGBT according to the embodiment 7 of the present invention.

FIG. 34 is a cross sectional view of other horizontal n-channel IGBT according to the embodiment 7 of the present invention generally denoted at 1150, which is illustration viewed from the same direction as the A-A direction in FIG. 1. In FIG. 34, the same reference symbols as those appearing in FIG. 20 denote the same or corresponding portions. The structure of the IGBT 1150 is the same that of the IGBT 1100 as it is modified to additionally include the buried insulation film 20.

As compared to the IGBT 350 according to the embodiment 3 (FIG. 20), the IGBT 1150 according to the embodiment 7 (FIG. 34) has the same structure as that of the IGBT 350 except for omission of the p-type emitter layers 7. In the IGBT 1150 as well, there is no p-type emitter, but instead the p-type base layer 5 serves also as a p-type emitter.

In the IGBTs 1100 and 1150 according to the embodiment 7, the p⁻ layer disposed in a lower section of the p-type base layer prevents latching-up of a parasitic thyristor and shortens the fall time (tf). This effect is remarkable particularly in the case of the IGBT 1150 including the buried insulation film in particular.

The structure is simple as the p-type base layer 5 serves also as a p-type emitter, which in turn simplifies the manufacturing process.

Embodiment 8

Figure 35:
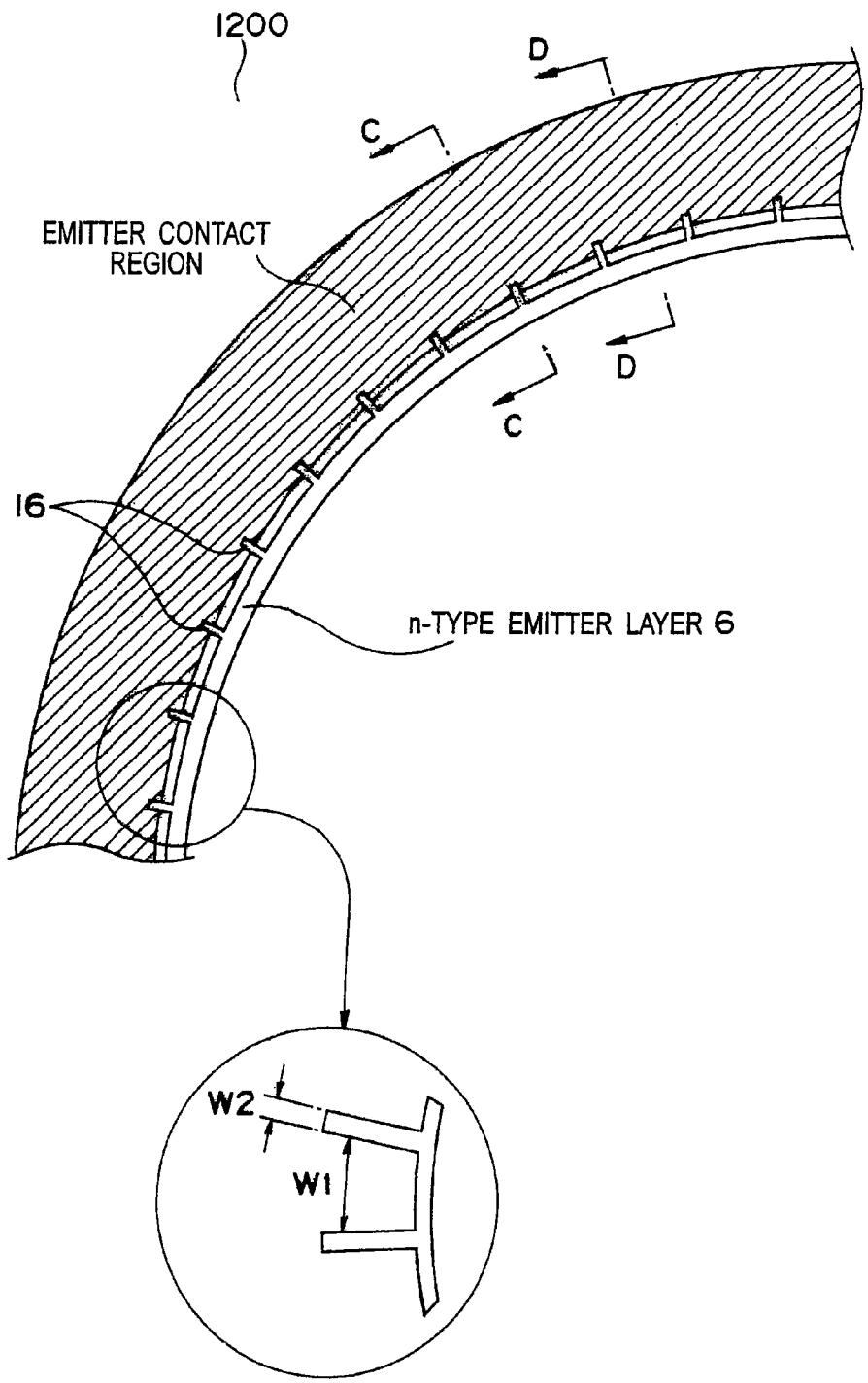
FIG. 35 is a top view of a part of an IGBT according to an embodiment 8 of the present invention.

FIG. 35 is a top view of a part of a horizontal n-channel IGBT according to the embodiment 8 of the present invention generally denoted at 1200, showing the n-type emitter (n⁺) layer 6 formed within the p-type base layer 5 (a connection region with an emitter electrode (emitter contact region)).

As in the IGBT 400 shown in FIG. 23, the n-type emitter layer 6 includes multiple outwardly protruding projections (convex areas) 16 in the IGBT 1200, and the relationship W1>W2 holds between the width of the projections 16 (W2) and the gap between the neighboring projections 16 (W1).

Figure 36:
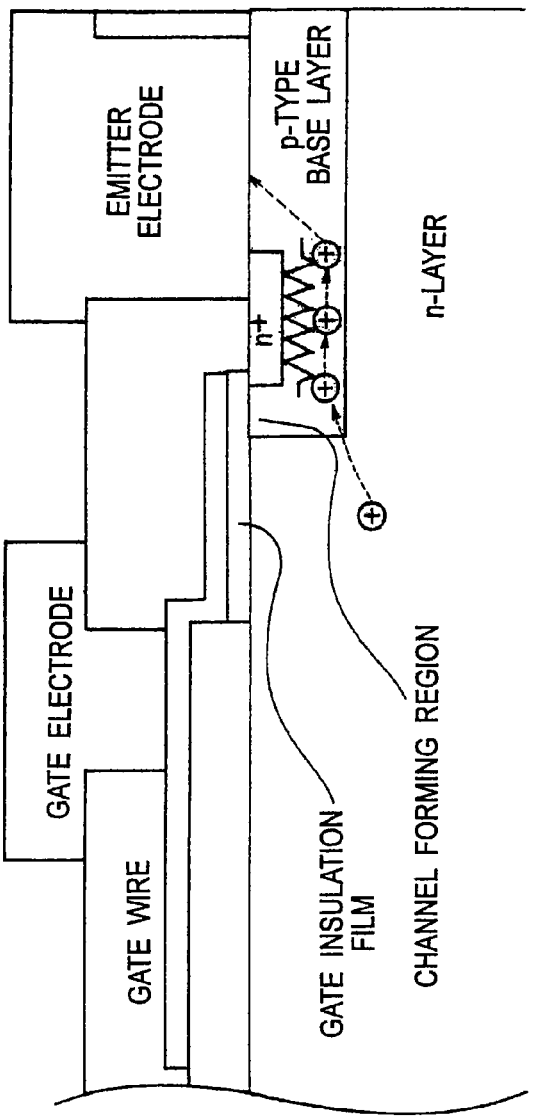
FIG. 36 is a cross sectional view of the IGBT according to the embodiment 8 of the present invention.
Figure 37:
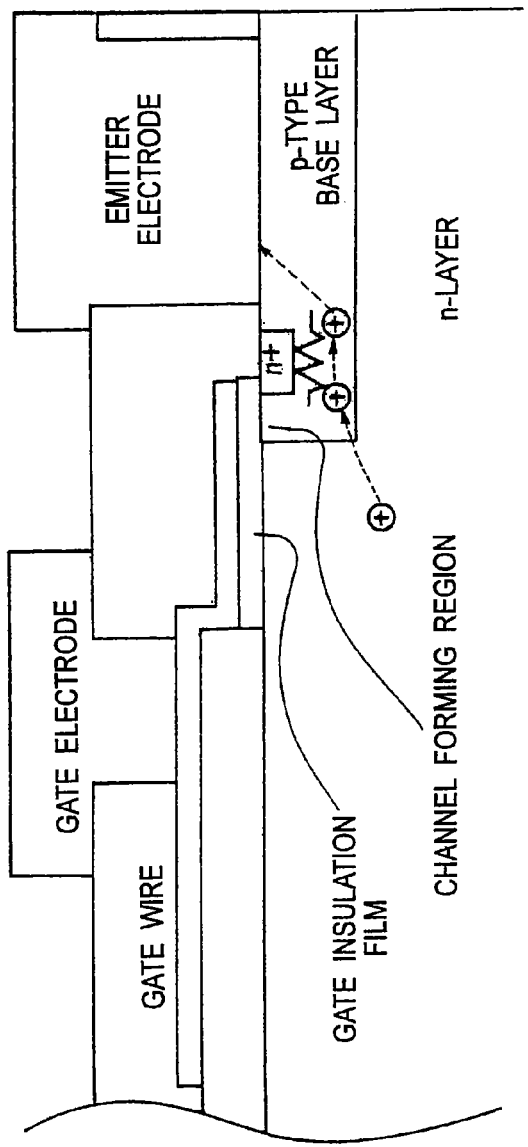
FIG. 37 is a cross sectional view of the IGBT according to the embodiment 8 of the present invention.

FIG. 36 is a cross sectional view of FIG. 35 taken along the direction C-C, and FIG. 37 is a cross sectional view of FIG. 35 taken along the direction D-D.

As compared to the IGBT 400 according to the embodiment 4 described above, the IGBT 1200 according to the embodiment 8 (FIGS. 36 and 37) has a structure which does not include the p-type emitter layers, except for which the structure is the same as that of the IGBT 400. In the IGBT 1200, there is no p-type emitter, but instead the p-type base layer 5 has a structure which serves also as a p-type emitter.

Having such a structure, the IGBT 1200 according to the embodiment 8 achieves an approximately similar effect to that according to the IGBT 400 described above. In addition, the structure is simple as the p-type base layer 5 serves also as a p-type emitter, which in turn simplifies the manufacturing process.

In other words, since the width of the n-type emitter (n+) is narrow in FIG. 37, the width of the p-type base layer right under the n-type emitter layer of a parasitic npn bipolar transistor formed by the n⁻ layer/the p-type base layer/the n-type emitter layer is narrow, and the base resistance of the p-type base region is low. This suppresses an operation of the parasitic npn bipolar transistor and prevents latching-up of a parasitic thyristor formed by the p-type collector layer/the n-type buffer layer/the n⁻ layer/the p-type base layer/the n-type emitter layer.

Thus, at the time of turning off or during the steady ON-state of the IGBT 1200 according to the embodiment 8, the latch-up tolerance of a parasitic thyristor improves in the IGBT.

Embodiment 9

Figure 38:
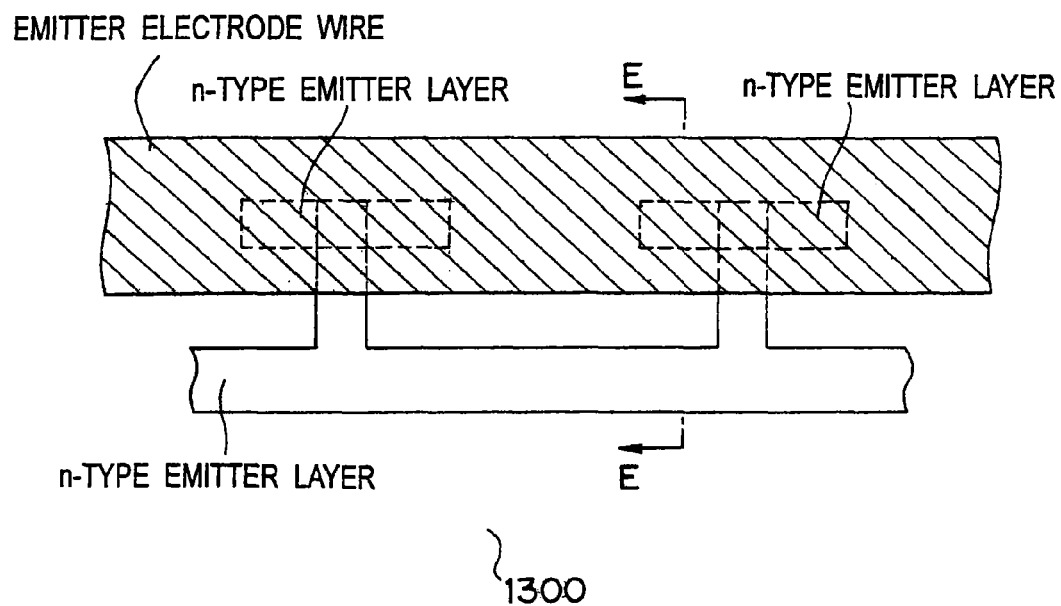
FIG. 38 is a top view which shows the arrangement of a p-type emitter layer in an IGBT according to an embodiment 9 of the present invention.
Figure 39:
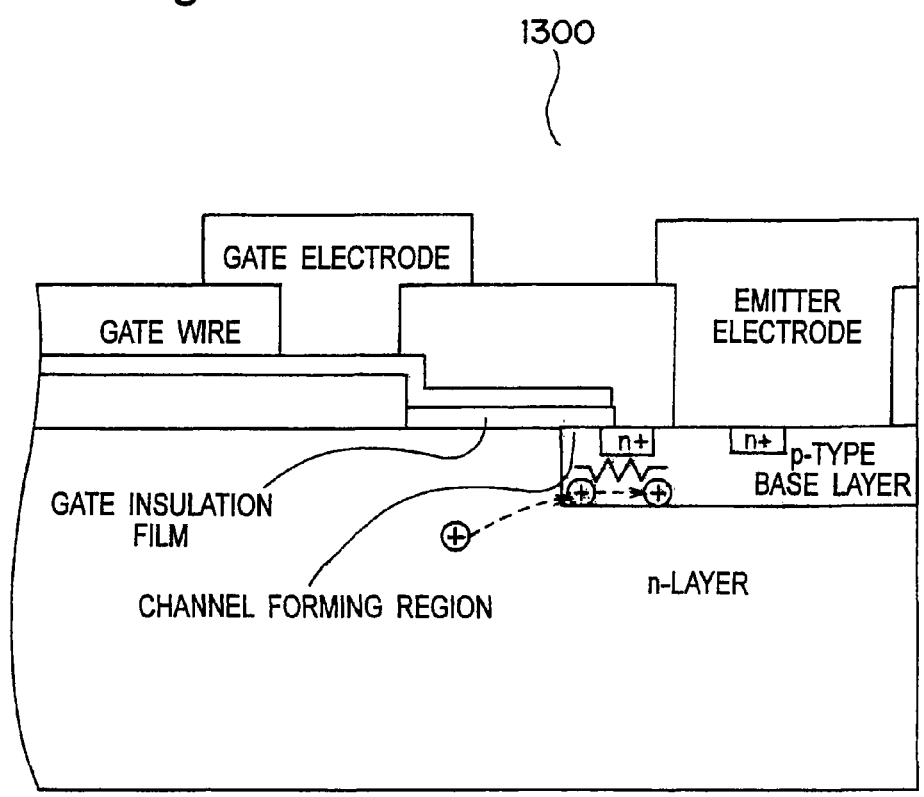
FIG. 39 is a cross sectional view of the IGBT according to the embodiment 9 of the present invention.

FIG. 38 is a top view of a part of a horizontal n-channel IGBT according to the embodiment 9 of the present invention generally denoted at 1300, showing a connection region (emitter contact region) between the n-type emitter layer and the emitter electrode. FIG. 39 is a cross sectional view of the IGBT 1300 shown in FIG. 38 taken along the direction E-E.

As compared to the IGBT 500 according to the embodiment 5 (FIGS. 28 and 29), the IGBT 1300 according to the embodiment 9 (FIGS. 38 and 39) has a structure which does not include the p-type emitter layers, except for which the structure is the same as that of the IGBT 500. In the IGBT 1300, there is no p-type emitter, but instead the p-type base layer 5 has a structure which serves also as a p-type emitter.

Having such a structure, the IGBT 1300 according to the embodiment 9 achieves an approximately similar effect to that according to the IGBT 500 described above. In addition, the structure is simple as the p-type base layer 5 serves also as a p-type emitter, which in turn simplifies the manufacturing process.

In other words, in the IGBT 1300, since the projections of the n-type emitter layer have T-shaped tips in addition to what the IGBT 400 according to the embodiment 4 includes, which increases the size of the area where the n-type emitter layer and emitter electrode wires contact each other and reduces the contact resistance between the n-type emitter layer and the emitter electrode wires. The result of this is an improved collector-emitter current ($I_{CE}$) characteristic upon application of the collector-emitter voltage ($V_{CE}$) in a condition that the constant gate-emitter voltage ($V_{GE}$) is applied.

Embodiment 10

Figure 40:
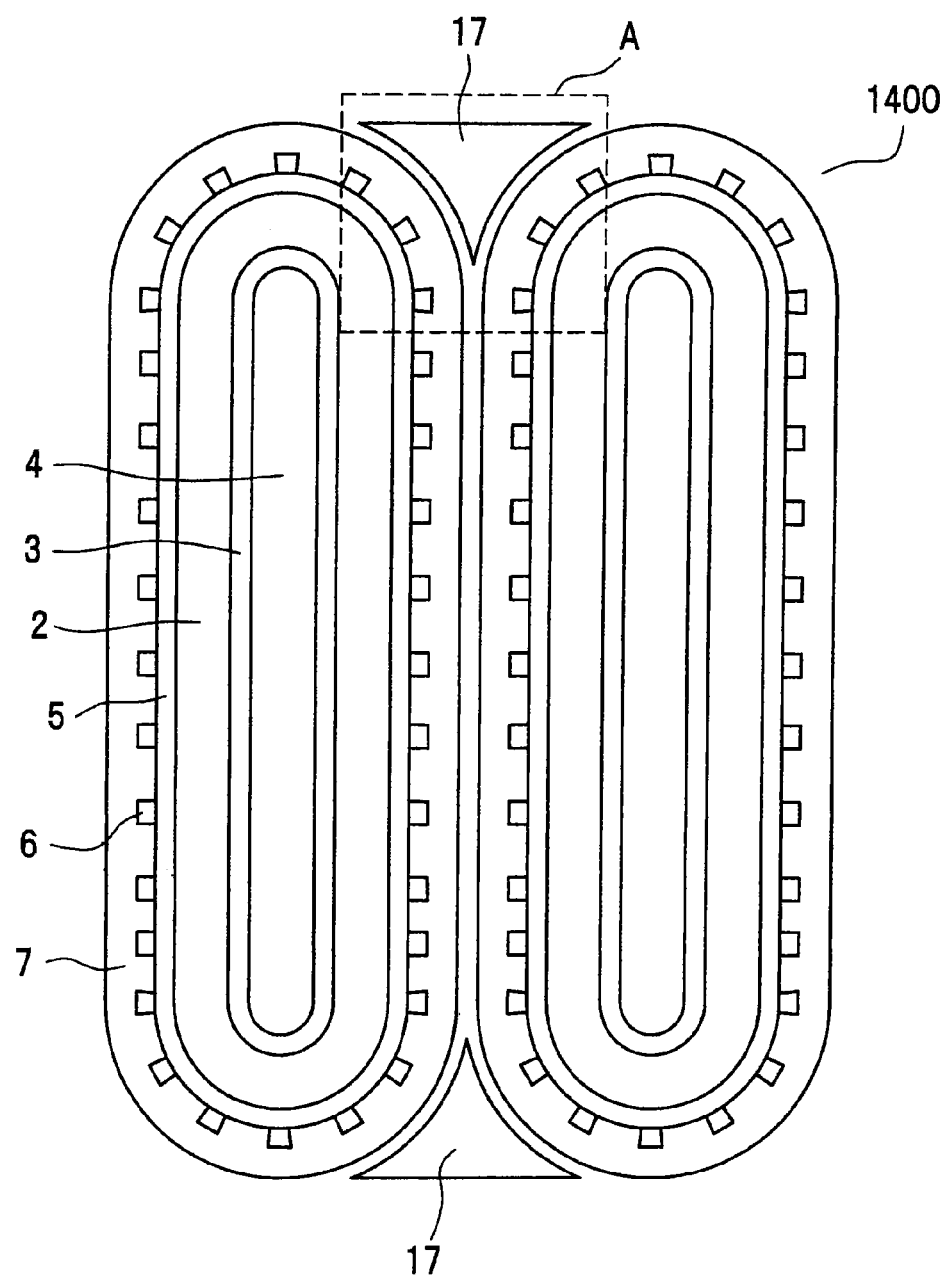
FIG. 40 is a top view of an IGBT according to an embodiment 10 of the present invention.
Figure 41:
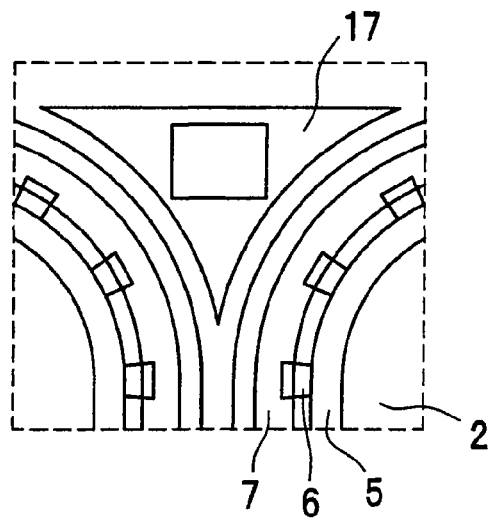
FIG. 41 is an enlarged view of the IGBT according to the embodiment 10 of the present invention.
Figure 42:
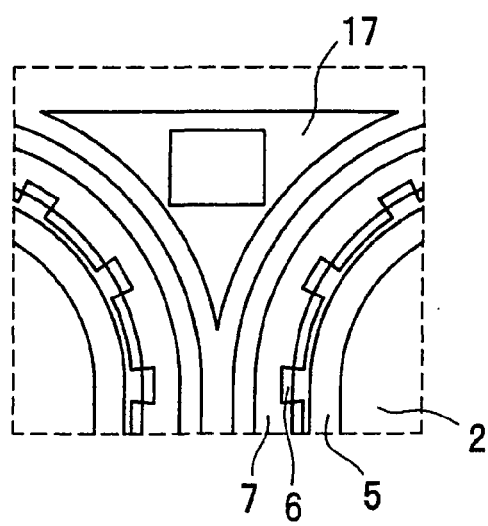
FIG. 42 is an enlarged view of the IGBT according to the embodiment 10 of the present invention.
Figure 43:
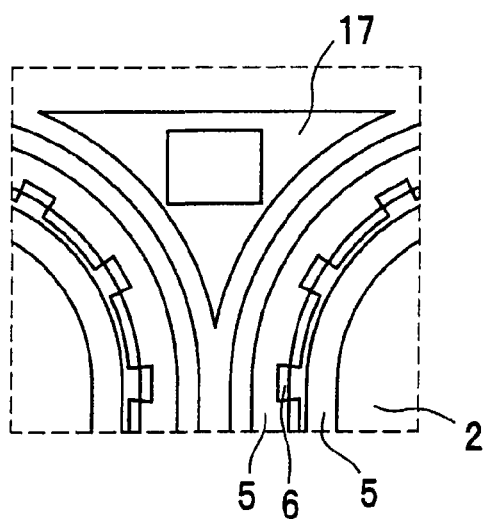
FIG. 43 is an enlarged view of the IGBT according to the embodiment 10 of the present invention.

FIG. 40 is a top view of a part of a horizontal n-channel IGBT according to the embodiment 10 of the present invention generally denoted at 1400, in which the same reference symbols as those appearing in FIG. 30 denote the same or corresponding portions. FIGS. 41 through 43 are enlarged views of the portion denoted at A in FIG. 40.

In the IGBT 1400 according to the embodiment 10, there are the p-type emitter layers 17 disposed in areas between a common contact line to adjacent two unit IGBTs and two IGBTs, which expands the area of the contact between the p-type emitter layers and the emitter electrode wires (emitter contact region) (FIGS. 41 through 43 show the emitter contact region.). This brings about a similar effect to that promised by the IGBT 650 according to the embodiment 6 described earlier (FIG. 31).

In short, it is possible to suppress an operation of a parasitic npn bipolar transistor formed by the n⁻ layer/the p-type base layer/the n-type emitter layer and to prevent latching-up of a parasitic thyristor formed by the p-type collector layer/the n-type buffer layer/the n⁻ layer/the p-type base layer/the n-type emitter layer. In consequence, at the time of turning off or during the steady ON-state of the horizontal n-channel IGBT 1400, the latch-up tolerance of a parasitic thyristor improves in the IGBT.

As shown in FIGS. 40 and 41, the n-type emitter layer may be disposed discontinuously along the p-type base layer 5 in the IGBT 1400. Alternatively, the n-type emitter layer 6 may be disposed in an endless shape although not shown.

Further alternatively, the n-type emitter layer 6 may have an endless-shape structure in which multiple outwardly-protruding projections (convex areas) are formed in the IGBT 1400, as shown in FIG. 42.

Yet another alternative is to use a structure without any p-type emitter layer 7 in the structure which is shown in FIG. 42, as shown in FIG. 43.

Figure 44:
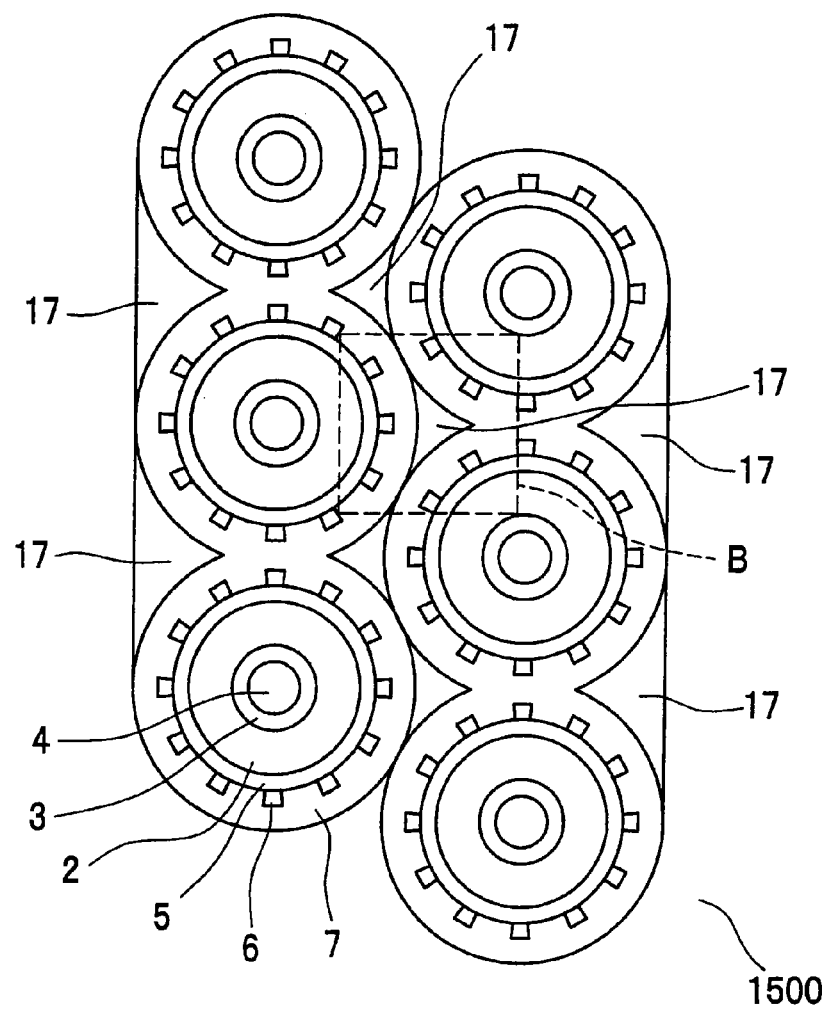
FIG. 44 is a top view of other IGBT according to the embodiment 10 of the present invention.
Figure 45:
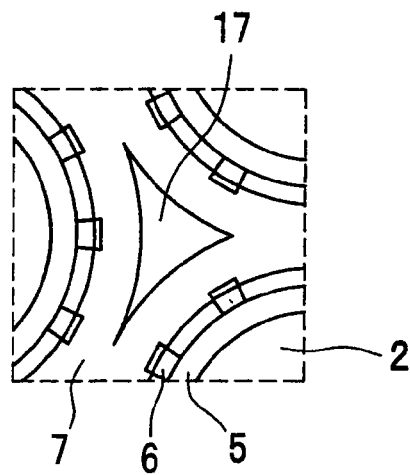
FIG. 45 is an enlarged view of another IGBT according to the embodiment 10 of the present invention.
Figure 46:
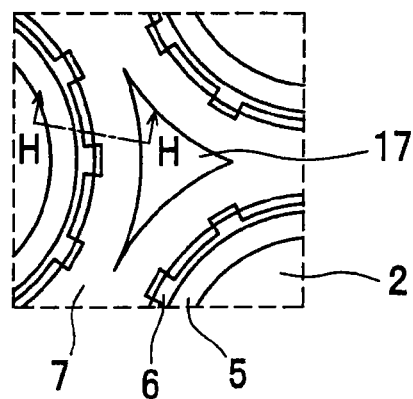
FIG. 46 is an enlarged view of another IGBT according to the embodiment 10 of the present invention.
Figure 47:
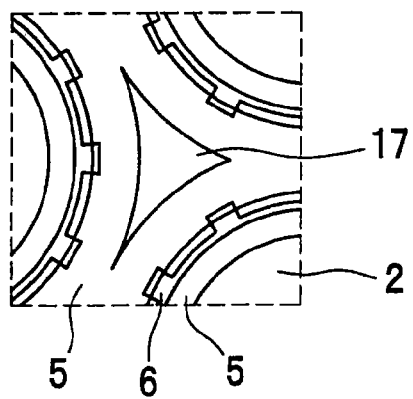
FIG. 47 is an enlarged view of another IGBT according to the embodiment 10 of the present invention.

The p-type emitter layers 17 of the IGBT 1400 according to this embodiment can be formed regardless of the shape of the n-type emitter layer 6 or whether there is the p-type emitter layers 7, thereby improving the latch-up tolerance of a parasitic thyristor at the time of turning off or during the steady ON-state of the IGBT 1400, FIG. 44 is a top view of other horizontal n-channel IGBT according to the embodiment 10 of the present invention generally denoted at 1500, in which the same reference symbols as those appearing in FIG. 30 denote the same or corresponding portions. FIGS. 45 through 47 are enlarged views of the portion denoted at B in FIG. 44.

In the IGBT 1500, there are the p-type emitter layers disposed in areas between a common contact line to adjacent two unit IGBTs and two IGBTs and areas enclosed by adjacent three unit IGBTs, which expands the area of the contact between the p-type emitter layers and the emitter electrode wires (emitter contact region) (FIGS. 44 through 47 show the emitter contact region.). This brings about a similar effect to that promised by the IGBT 600 according to the embodiment 6 described earlier (FIG. 30).

In short, it is possible to suppress an operation of a parasitic npn bipolar transistor formed by the n⁻ layer/the p-type base layer/the n-type emitter layer and to prevent latching-up of a parasitic thyristor formed by the p-type collector layer/the n-type buffer layer/the n⁻ layer/the p-type base layer/the n-type emitter layer. In consequence, at the time of turning off or during the steady ON-state of the horizontal n-channel IGBT 1500, the latch-up tolerance of a parasitic thyristor improves in the IGBT.

As shown in FIGS. 44 and 45, the n-type emitter layer may be disposed discontinuously along the p-type base layer 5 in the IGBT 1500. Alternatively, the n-type emitter layer 6 may be disposed in an endless shape although not shown.

Further alternatively, the n-type emitter layer 6 may have an endless-shape structure in which multiple outwardly-protruding projections (convex areas) are formed in the IGBT 1400, as shown in FIG. 46.

Yet another alternative is to use a structure without any p-type emitter layer 7 in the structure which is shown in FIG. 46, as shown in FIG. 47.

Figure 48:
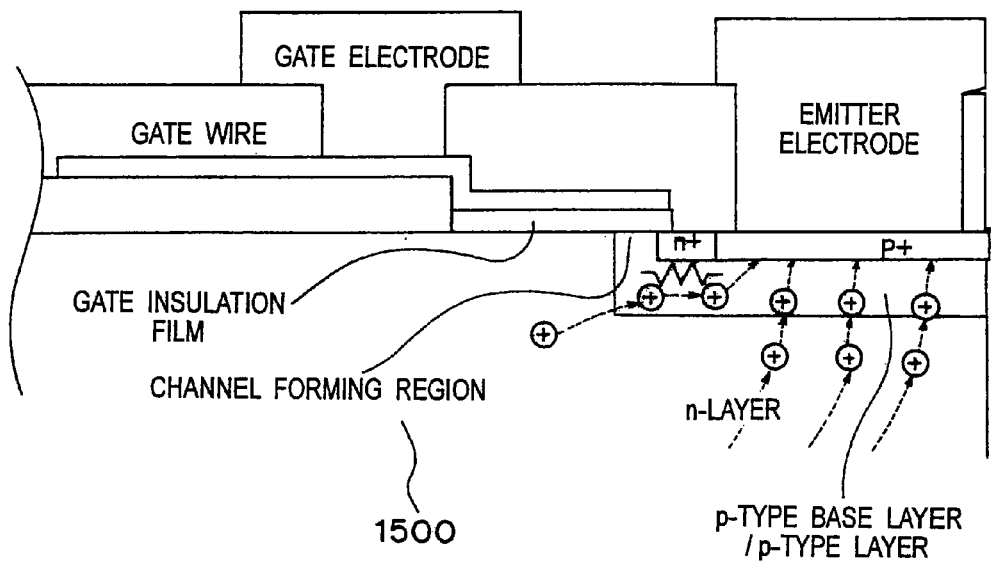
FIG. 48 is a cross sectional view of the IGBT according to the embodiment 10 of the present invention.
Figure 49:
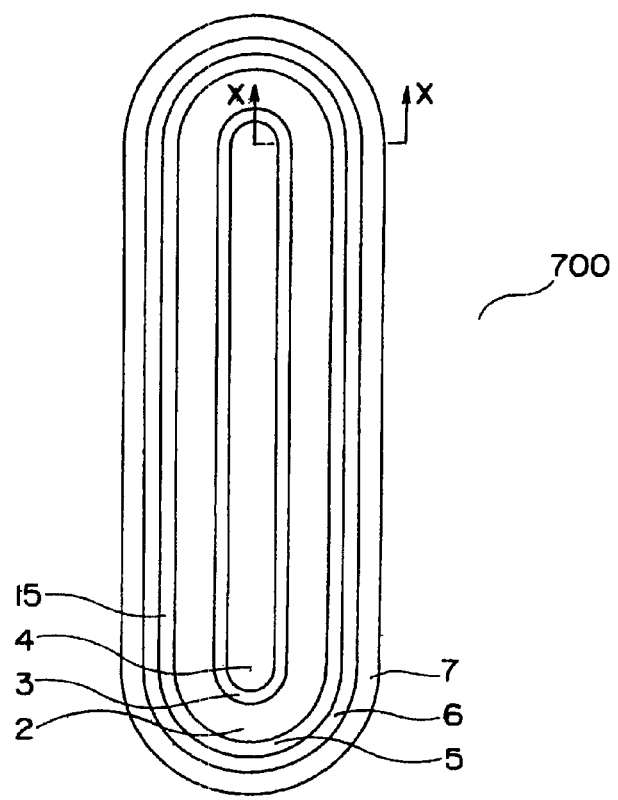
FIG. 49 is a top view of a conventional IGBT.

In this structure, the p-type emitter layers 7 and 17 are relatively wider than the n-type emitter layer 6. This reduces the contact resistance between the p-type emitter layers 7 and 17 and emitter wires, and ensures a smooth flow of holes to the contact region, where the p-type emitter (p$^+$) layers and the emitter wires (emitter electrode) contact, without becoming stagnant immediately below the n-type emitter layer as shown in FIG. 48 (the cross sectional view of FIG. 46 taken along the direction H-H). An indirect reason behind this is the reduced base resistance at the p-type base region right under the n-type emitter layer.

This suppresses an operation of a parasitic npn bipolar transistor formed by the n$^-$ layer/the p-type base layer/the n-type emitter layer and prevents latching-up of a parasitic thyristor formed by the p-type collector layer/the n-type buffer layer/the n$^-$ layer/the p-type base layer/the n-type emitter layer. In consequence, at the time of turning off or during the steady ON-state of the horizontal n-channel IGBT 1500, the latch-up tolerance of a parasitic thyristor improves in the IGBT.

Although the embodiments 1 through 10 are directed to horizontal n-channel IGBTs, the present invention is applicable also to a horizontal p-channel IGBT in which case the p-type and the n-type appearing in the description above should be replaced with each other.

The present invention is further applicable to a horizontal MOSFET, a horizontal device using other MOS gate structure or the like.

What is claimed is:

1. A horizontal semiconductor device, comprising:
a plurality of unit transistors, a first one of the plurality of unit transistors abutting and adjacent to a second one of the plurality of unit transistors,
each of the plurality of unit transistors including
a semiconductor substrate of a first conductivity type;
a semiconductor region of a second conductivity type formed on said semiconductor substrate;
a collector layer of the first conductivity type formed within said semiconductor region;
an endless base layer of the first conductivity type formed within said semiconductor region such that said endless base layer is off said collector layer but surrounds said collector layer;
an endless first emitter layer of the second conductivity type formed in said endless base layer; and
an emitter electrode electrically connected with the endless first emitter layer, wherein a movement of carriers between said endless first emitter layer and said collector layer is controlled in a channel region formed in said endless base layer, an insulation film is disposed between said semiconductor substrate and said semiconductor region, and a region of the first conductivity type is disposed in said semiconductor region to contact with a surface of said endless base layer nearest said semiconductor substrate, the emitter electrode extending farther toward the collector layer than the region of the first conductivity type extends toward the collector layer.

2. The horizontal semiconductor device according to claim 1, wherein each of the plurality of unit transistors also includes a second emitter layer of the first conductivity type formed within said endless base layer.

3. The horizontal semiconductor device according to claim 1, wherein the semiconductor region extends further toward the semiconductor substrate from the endless base layer than the region of the first conductivity type extends toward the semiconductor substrate from the endless base layer.

4. The horizontal semiconductor device according to claim 1, wherein the region of the first conductivity tape has a concentration of impurities of the first conductivity type lower than a concentration of impurities of the first conductivity type of the endless base layer.

5. The horizontal semiconductor device according to claim 2, wherein the second emitter layer extends farther toward the collector layer than the region of the first conductivity type extends toward the collector layer.

6. The horizontal semiconductor device according to claim 2, wherein the second emitter layer of the first one of the plurality of unit transistors abuts the second emitter layer of the second one of the plurality of unit transistors.

7. A horizontal semiconductor device, comprising:
a plurality of unit transistors, a first one of the plurality of unit transistors abutting and adjacent to a second one of the plurality of unit transistors,
each of the plurality of unit transistors including
a semiconductor substrate of a first conductivity type;
a semiconductor region of a second conductivity type formed on said semiconductor substrate;
a collector layer of the first conductivity type formed within said semiconductor region;
an endless base layer of the first conductivity type formed within said semiconductor region such that said endless base layer is off said collector layer but surrounds said collector layer; and
an endless first emitter layer of the second conductivity type formed in said endless base layer,
wherein a movement of carriers between said endless first emitter layer and said collector layer is controlled in a channel region formed in said endless base layer, an insulation film is disposed between said semiconductor substrate and said semiconductor region, a region of the first conductivity type is disposed in said semiconductor region to contact with a surface of said endless base layer nearest said semiconductor substrate, each of the plurality of unit transistors also includes a second emitter layer of the first conductivity type formed within said endless base layer, and the second emitter layer of the first one of the plurality of unit transistors abuts the second emitter layer of the second one of the plurality of unit transistors.

8. A horizontal semiconductor device, comprising:
a plurality of unit transistors, a first one of the plurality of unit transistors abutting and adjacent to a second one of the plurality of unit transistors,
each of the plurality of unit transistors including
a semiconductor substrate of a first conductivity type;
a semiconductor region of a second conductivity type on said semiconductor substrate;
a collector layer of the first conductivity type within said semiconductor region;
an endless base layer of the first conductivity type within said semiconductor region such that said endless base layer is off said collector layer but surrounds said collector layer;
a region of the first conductivity type in said semiconductor region and contacting with a surface of said endless base layer nearest said semiconductor substrate;

an endless first emitter layer of the second conductivity type in said endless base layer, wherein a movement of carriers between said endless first emitter layer and said collector layer is controlled in a channel region formed in said endless base layer;

an emitter electrode electrically connected with the endless first emitter layer, the emitter electrode extending farther toward the collector layer than the region of the first conductivity type extends toward the collector layer; and means for facilitating a depletion toward the collector layer from said endless base layer.

* * * * *